US008399337B2

(12) United States Patent
Akimoto et al.

(10) Patent No.: US 8,399,337 B2
(45) Date of Patent: Mar. 19, 2013

(54) METHOD FOR MANUFACTURING SOI SUBSTRATE AND METHOD FOR MANUFACTURING SEMICONDUCTOR DEVICE

(75) Inventors: Kengo Akimoto, Atsugi (JP); Yuta Endo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 104 days.

(21) Appl. No.: 13/045,810

(22) Filed: Mar. 11, 2011

(65) Prior Publication Data

US 2011/0159611 A1 Jun. 30, 2011

Related U.S. Application Data

(63) Continuation of application No. 12/232,131, filed on Sep. 11, 2008, now Pat. No. 7,951,689.

(30) Foreign Application Priority Data

Sep. 14, 2007 (JP) ................................. 2007-239167

(51) Int. Cl.
*H01L 21/30* (2006.01)
(52) U.S. Cl. .......................................... 438/458; 438/30
(58) Field of Classification Search .................. 438/30, 438/149–166, 455–459; 257/347, 506, 507
See application file for complete search history.

(56) References Cited

U.S. PATENT DOCUMENTS

| | | | |
|---|---|---|---|
| 5,670,411 A | 9/1997 | Yonehara et al. | |
| 6,020,252 A | 2/2000 | Aspar et al. | |
| 6,191,007 B1 | 2/2001 | Matsui et al. | |
| 6,225,192 B1 | 5/2001 | Aspar et al. | |
| 6,261,957 B1 | 7/2001 | Jang et al. | |
| 6,372,609 B1 | 4/2002 | Aga et al. | |
| 6,380,046 B1 | 4/2002 | Yamazaki | |
| 6,475,072 B1 | 11/2002 | Canaperi et al. | |
| 6,525,415 B2 | 2/2003 | Koyanagi et al. | |
| 6,809,009 B2 | 10/2004 | Aspar et al. | |
| 6,982,181 B2 * | 1/2006 | Hideo | 438/30 |
| 7,029,950 B2 | 4/2006 | Yonehara et al. | |
| 7,067,396 B2 | 6/2006 | Aspar et al. | |
| 7,071,029 B2 * | 7/2006 | Ghyselen et al. | 438/455 |
| 7,094,665 B2 | 8/2006 | Shimoda et al. | |

(Continued)

FOREIGN PATENT DOCUMENTS

| | | |
|---|---|---|
| JP | 01-270322 | 10/1989 |
| JP | 05-335482 | 12/1993 |

(Continued)

*Primary Examiner* — Fernando L Toledo
*Assistant Examiner* — Bryan Junge
(74) *Attorney, Agent, or Firm* — Eric J. Robinson; Robinson Intellectual Property Law Office, P.C.

(57) ABSTRACT

A highly reliable semiconductor device capable of high speed operation is manufactured over a flexible substrate at a high yield. A separation layer is formed over an insulating substrate by a sputtering method; the separation layer is flattened by a reverse sputtering method; an insulating film is formed over the flattened separation layer; a damaged area is formed by introducing hydrogen or the like into a semiconductor substrate; an insulating film is formed over the semiconductor substrate in which the damaged area is formed; the insulating film formed over the insulating substrate is bonded to the insulating film formed over the semiconductor substrate, the semiconductor substrate is separated at the damaged area so that a semiconductor layer is formed over the insulating substrate; the semiconductor layer is flattened so as to form an SOI substrate; and the semiconductor device is formed over the SOI substrate.

14 Claims, 13 Drawing Sheets

U.S. PATENT DOCUMENTS

| | | | |
|---|---|---|---|
| 7,179,719 B2 | 2/2007 | Droes et al. | |
| 7,183,179 B2 | 2/2007 | Droes et al. | |
| 7,199,024 B2 | 4/2007 | Yamazaki | |
| 7,262,088 B2 | 8/2007 | Kodaira et al. | |
| 7,332,381 B2 | 2/2008 | Maruyama et al. | |
| 7,332,412 B2 | 2/2008 | Park et al. | |
| 7,387,946 B2 | 6/2008 | Dao | |
| 7,456,059 B2 | 11/2008 | Kodaira et al. | |
| 7,498,234 B2 | 3/2009 | Aspar et al. | |
| 7,508,034 B2 | 3/2009 | Takafuji et al. | |
| 7,521,335 B2 | 4/2009 | Yamanaka | |
| 7,538,008 B2 | 5/2009 | Feijoo et al. | |
| 7,648,862 B2 | 1/2010 | Maruyama et al. | |
| 7,709,337 B2 | 5/2010 | Jinbo et al. | |
| 7,745,252 B2 | 6/2010 | Suzuki et al. | |
| 2002/0100941 A1 | 8/2002 | Yonehara et al. | |
| 2007/0045621 A1* | 3/2007 | Suzuki et al. | 257/40 |

FOREIGN PATENT DOCUMENTS

| | | |
|---|---|---|
| JP | 11-163363 | 6/1999 |
| JP | 2000-077287 | 3/2000 |
| JP | 2003-204049 | 7/2003 |
| WO | WO 01/11667 | 2/2001 |

* cited by examiner

FIG. 2A-1   FIG. 2A-2
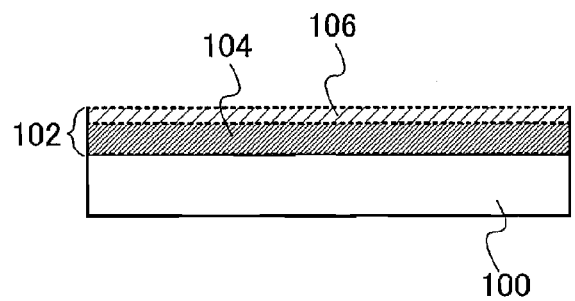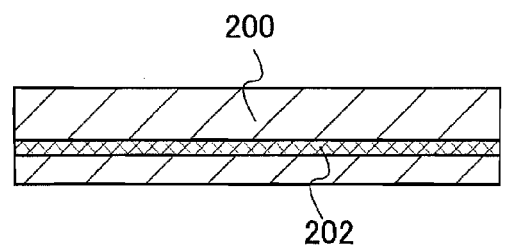
FIG. 2B-1   FIG. 2B-2
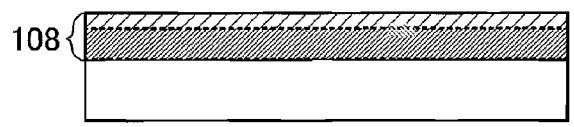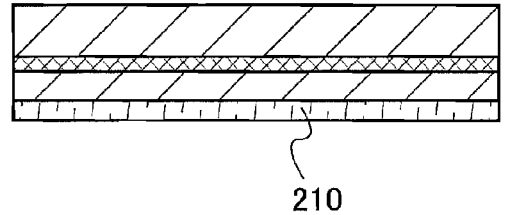
FIG. 2C
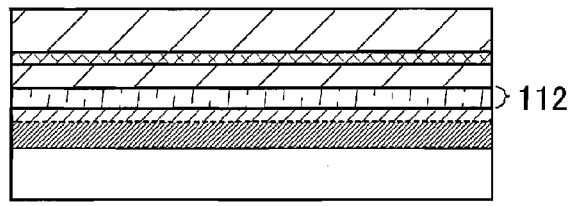
FIG. 2D
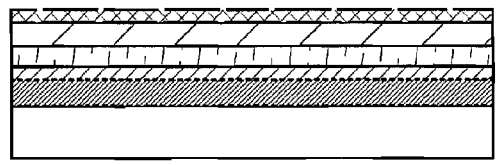
FIG. 2E
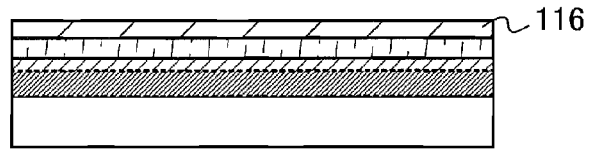

METHOD FOR MANUFACTURING SOI SUBSTRATE AND METHOD FOR MANUFACTURING SEMICONDUCTOR DEVICE

BACKGROUND OF THE INVENTION

1. Field of the Invention

The present invention relates to a semiconductor substrate having an SOI (silicon on insulator) structure, and a method for manufacturing a semiconductor device.

2. Description of the Related Art

A semiconductor substrate having an SOI structure that has a thin single crystal semiconductor layer on an insulating layer (hereinafter referred to as an SOI substrate) has been developed instead of a silicon wafer that is manufactured by thinly slicing an ingot of a single crystal semiconductor. Since parasitic capacitance of a transistor is small in an integrated circuit provided over an SOI substrate, it is considered to be effective for improvement of operation speed and reduction in consumption power. Thus, application of an SOI substrate to high-performance semiconductor devices such as a microprocessor has been expected.

As a method for manufacturing an SOI substrate, a hydrogen ion implantation separation method is known (e.g., see Reference 1: U.S. Pat. No. 6,372,609). The hydrogen ion implantation separation method is a technique by which hydrogen ions are implanted into a silicon wafer to form a microbubble layer at a predetermined depth from a surface, and the silicon wafer is bonded to another silicon wafer using the microbubble layer as a cleavage plane so that a thin silicon layer (hereinafter referred to as an SOI layer) is formed over the another silicon wafer. According to this technique, in addition to heat treatment for separation of an SOI layer, it is necessary to perform heat treatment in an oxidizing atmosphere to form an oxide film on the SOI layer, remove the oxide film, and perform heat treatment at 1000° C. to 1300° C. in a reducing atmosphere to increase bonding strength. To increase the bonding strength, to enhance flatness of a surface to be bonded is considered to be effective.

On the other hand, a semiconductor device, in which a single crystal silicon layer is provided over an insulating substrate such as a high heat-resistant glass substrate, is disclosed (see Reference 2: Japanese Published Patent Application No. H11-163363). The semiconductor device has a structure in which the entire surface of crystallized glass having a strain point of 750° C. or higher is protected with an insulating silicon film, and a single crystal silicon layer obtained by a hydrogen ion implantation separation method is bonded firmly to the insulating silicon film.

Now, it is known that a flexible semiconductor device can be manufactured by using a flexible substrate as a substrate provided with a semiconductor device (see reference 3: Japanese Published Patent Application No. 2003-204049). As a method for manufacturing a semiconductor device having a semiconductor layer over a flexible substrate, there is a method in which a semiconductor layer is directly formed over a flexible substrate. However, a method for forming a separation layer over a substrate which has a certain heat resistance; forming an element which has a semiconductor layer over the separation layer; and transferring the element to the flexible substrate using the separation layer as a trigger, is preferably used. At this time, the separation layer is provided, for example, by a sputtering method or the like.

SUMMARY OF THE INVENTION

It is an object of the present invention to provide a method for manufacturing a semiconductor substrate having an SOI structure over a substrate with low heat resistance and low chemical resistance.

Further, it is another object of the present invention to provide a method for manufacturing a highly reliable semiconductor device capable of high speed operation over a substrate having low heat resistance and low chemical resistance at a high yield. Furthermore, it is still another object of the present invention to provide a highly reliable semiconductor device capable of high speed operation which is manufactured by applying the manufacturing method.

Here, as a substrate having low heat resistance and low chemical resistance, a flexible plastic substrate is given. Therefore, it is an object of the present invention to manufacture a semiconductor substrate having an SOI structure over a flexible substrate (specifically, over a flexible plastic substrate). Moreover, it is further object of the present invention to provide a method for manufacturing a highly reliable semiconductor device at a high yield using the semiconductor substrate. It is still further object of the present invention to provide a highly reliable semiconductor device capable of high speed operation which is manufactured by the manufacturing method.

In the present invention, a semiconductor device is manufactured by forming a separation layer having superior flatness over a first substrate (an insulating substrate or the like) or a semiconductor substrate; bonding the first substrate and the semiconductor substrate; forming a semiconductor element over the separation layer; and transferring the semiconductor element to a second substrate (a flexible substrate or the like).

One aspect of the present invention provides a method for manufacturing a semiconductor device in which a single crystal semiconductor layer is provided over a substrate, which includes the steps of: forming a separation layer over the substrate; flattening the reparation layer; bonding a semiconductor substrate having a damaged area to the substrate having the separation layer; and separating the semiconductor substrate at the damaged area.

One aspect of the present invention provides a method for manufacturing a semiconductor device which includes the steps of: forming a separation layer over a first substrate; flattening the separation layer; forming an insulating film over the flattened separation layer by a sputtering method or a chemical vapor deposition method; forming a damaged area at a certain depth from a surface of a semiconductor substrate; attaching the insulating film formed over the first substrate and the semiconductor substrate and separating the semiconductor substrate at the damaged area so as to form a semiconductor layer over the first substrate; forming a semiconductor element having the semiconductor layer; and transferring the semiconductor layer to a second substrate.

One aspect of the present invention provides a method for manufacturing a semiconductor device which includes the steps of: forming a separation layer over a first substrate; flattening the separation layer, forming an insulating film over the flattened separation layer by a sputtering method or a chemical vapor deposition method, forming a damaged area at a certain depth from a surface of a semiconductor substrate; forming an insulating film over the semiconductor substrate in which the damaged area is formed; bonding the insulating film formed over the first substrate to the insulating film formed over the semiconductor substrate; and separating the semiconductor substrate at the damaged area, so that a semiconductor layer is formed over the first substrate; forming a semiconductor element having the semiconductor layer; and transferring the semiconductor element to a second substrate.

One aspect of the present invention provides a method for manufacturing a semiconductor device which includes the steps of: forming a damaged area at a certain depth from a surface of a semiconductor substrate; forming a separation layer over the semiconductor substrate in which the damaged area is formed; flattening the separation layer; forming an insulating film over the flattened separation layer by a sputtering method or a chemical vapor deposition method, bonding the first substrate to the insulating film formed over the semiconductor substrate, and separating the semiconductor substrate at the damaged area, so that a semiconductor layer is formed over the first substrate; forming a semiconductor element having the semiconductor layer; and transferring the semiconductor element to a second substrate.

One aspect of the present invention provides a method for manufacturing a semiconductor device which includes the steps of: forming a damaged area at a certain depth from a surface of a semiconductor substrate; forming a separation layer over the semiconductor substrate in which the damaged area is formed; flattening the separation layer; forming an insulating film over the flattened separation layer by a sputtering method or a chemical vapor deposition method; forming an insulating film over a first substrate; bonding the insulating film formed over the first substrate to the insulating film formed over the semiconductor substrate, and separating the semiconductor substrate at the damaged area, so that a semiconductor layer is formed over the first substrate; forming a semiconductor element having the semiconductor layer; and transferring the semiconductor element to a second substrate.

One aspect of the present invention provides a method for manufacturing a semiconductor device which includes the steps of: forming a separation layer over a first substrate; flattening the separation layer, forming a damaged area at a certain depth from a surface of a semiconductor substrate; forming an insulating film over the semiconductor substrate in which the damaged area is formed by a sputtering method or a chemical vapor deposition method; bonding the separation layer formed over the first substrate to the insulating film formed over the semiconductor substrate, and separating the semiconductor substrate at the damaged area, so that a semiconductor layer is formed over the first substrate; forming a semiconductor element having the semiconductor layer; and transferring the semiconductor element to the second substrate.

One aspect of the present invention provides a method for manufacturing a semiconductor device which includes the steps of: forming a damaged area at a certain depth from a surface of the semiconductor substrate; forming a separation layer over the semiconductor substrate in which the damaged area is formed; flattening the separation layer; forming an insulating film over a first substrate by a sputtering method or a chemical vapor deposition method; bonding the insulating film formed over the first substrate to the separation layer formed over the semiconductor substrate, and separating the semiconductor substrate at the damaged area, so that a semiconductor layer is formed over the first substrate; forming a semiconductor element having the semiconductor layer; and transferring the semiconductor element to the second substrate.

In the present invention having any of the foregoing structure, the surface of the insulating film which is manufactured by a sputtering method or a chemical vapor deposition method reflects a shape of a base. Thus, it is effective to flatten the separation layer.

In the present invention having any of the foregoing structures, it is preferable that the separation layer be formed by a sputtering method, and the separation layer be flattened by a reverse sputtering method. This is because the separation layer can be formed and flattened in the same apparatus, and throughput is high.

In the present invention having any of the foregoing structures, it is preferable that the insulating substrate be a glass substrate. This is because a glass substrate having a large area can be manufactured and productivity can be improved by using the glass substrate as an insulating substrate.

In the present invention having any of the foregoing structures, it is preferable that the semiconductor substrate be made of a single crystal silicon substrate. This is because a semiconductor device capable of high speed operation can be manufactured by using a single crystal substrate as a semiconductor substrate. Furthermore, by using a silicon substrate, a process with high versatility can be employed.

In the present invention having any of the foregoing structure, as the separation layer, a stacked-layer structure in which a silicon oxide layer is provided over a molybdenum layer; a stacked-layer structure in which a silicon oxide layer is provided over a tungsten layer; a stacked-layer structure in which an aluminum oxide layer is provided over a tungsten layer; or the like is given; however, a separation layer having a stacked-layer structure in which a silicon oxide layer is provided over a tungsten layer is preferably used. This is because adhesiveness required in a manufacturing step can be easily secured using the separation layer having such a structure.

Note that the flatness required for this specification may be greater than or equal to a degree that the first substrate and the semiconductor substrate can be bonded to each other. The first substrate and the semiconductor substrate can be preferably bonded to each other when a surface to be bonded has average surface roughness, $R_a \leq 0.7$ nm; square of average surface roughness, $R_{ms} \leq 0.9$ nm; and the value of the largest difference in height between peak and valley, $R_{max} \leq 9.2$ nm.

Here, a measurement surface is to be a rectangular region within four points represented by the coordinates $(x_1, y_1)$, $y_2)$, $(x_2, y_1)$, and $(x_2, y_2)$, and this area is referred to as $S_0$. When a measurement surface is represented by S, and roughness at the measurement surface is represented by a function, $f(x)$, average surface roughness, $R_a$ is defined by formula (1) below.

$$R_a = \frac{1}{S_0} \int\int_S |f(S) - Z_0| dS \qquad \text{Formula 1}$$

Note that $Z_0$ is an average height of the measurement surface and represented by formula (2) below.

$$Z_0 = \frac{1}{S_0} \int_{y_1}^{y_2} \int_{x_1}^{x_2} f(x, y) dx dy \qquad \text{Formula 2}$$

Note that when the coordinates $(x_1, y_1)$, $(x_1, y_2)$, $(x_2, y_1)$, and $(x_2, y_2)$ are used, formula 1 can be defined as formula (3) below.

$$R_a = \frac{1}{S_0} \int_{y1}^{y2} \int_{x1}^{x2} |f(x, y) - Z_0| dx dy \qquad \text{Formula 3}$$

The square of average surface roughness, $R_{ms}$ can be defined as formula (4) below.

$$R_{ms} = \sqrt{\frac{1}{S_0} \int_{y1}^{y2} \int_{x1}^{x2} \{f(x, y) - Z_0\}^2 dx} \qquad \text{Formula 4}$$

It is to be noted that in this specification, a substrate having low heat resistance is a substrate in which the upper temperature limit is equal to or lower than the highest temperature in manufacturing steps of a semiconductor device. That is, a substrate having low heat resistance is a substrate, in which the substrate is subjected to deformation, damage, or the like at the highest temperature in manufacturing steps of a semiconductor device. Similarly, a substrate having low chemical resistance is a substrate, in which the substrate is subjected to deformation, damage, or the like by a chemical or the like used in manufacturing steps of a semiconductor device.

In this specification, hydrophilicity is defined by a contact angle of water on a solid surface. Here, the contact angle is an angle θ made by the solid surface and a tangent line of a liquid drop at the edge of dropped dots (see FIG. 13). In the case where the contact angle when water is dropped to the solid surface is 0° or more and 90° or less, the solid surface has hydrophilicity, and in the case where the contact angle when water is dropped to a solid surface is 90° or more and 180° or less, the solid surface has water repellency.

In this specification, a step of transferring a semiconductor element or the like includes steps of bonding the semiconductor element formed over the first substrate and another substrate (a second substrate) and a step of separating the semiconductor element from the first substrate. By such a transferring step, the semiconductor element is formed over the second substrate.

According to the present invention, a semiconductor substrate having an SOI structure can be formed over a substrate with low heat resistance and low chemical resistance. Thus, the SOI structure can be provided over a flexible substrate (for example, a plastic substrate). As a result, a highly reliable semiconductor device capable of high speed operation can be manufactured at a high yield.

BRIEF DESCRIPTION OF THE DRAWINGS

FIGS. 2A-1, 2B-1, 2A-2, 2B-2 and 2C to 2E illustrate an example of a method for manufacturing an SOI substrate of the present invention;

FIGS. 3A-1 to 3C-1, 3A-2 and 3D to 3F illustrate an example of a method for manufacturing an SOI substrate of the present invention;

FIGS. 4A-1, 4A-2 to 4C-2 and 4D to 4F illustrate an example of a method for manufacturing an SOI substrate of the present invention;

FIGS. 5A-1, 5A-2 to 5C-2 and 5D to 5F illustrate an example of a method for manufacturing an SOI substrate of the present invention;

FIG. 6A-1, 6A-2 to 6C-2, and 6D to 6F illustrate an example of a method for manufacturing an SOI substrate of the present invention;

DETAILED DESCRIPTION OF THE INVENTION

Embodiment Mode

Figures 1, 1A:
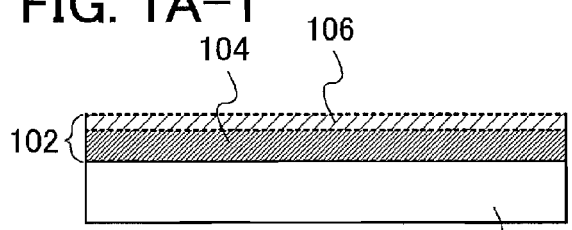
FIGS. 1A-1 to 1C-1, 1A-2, 1B-2, and 1D to 1F illustrate an example of a method for manufacturing an SOI substrate of the present invention.

Hereinafter, embodiment modes of the invention are described with reference to the drawings. However, the present invention is not limited to the description given below, and it will be easily appreciated by those skilled in the art that various changes and modifications of the modes and details are possible, unless such changes and modifications depart from the content and the scope of the invention. Thus, the present invention is not interpreted while limiting to the following description of the embodiment modes and embodiment. In the description for explaining the structure of the invention with reference to drawings, like reference numerals are used to designate identical portions or portions having a similar function in different drawings for illustrating embodiment modes.

Embodiment Mode 1

In this embodiment mode, an example of a method for manufacturing a semiconductor device of the present invention is described with reference to drawings. In the following description, a first substrate 100 and a semiconductor substrate 200 are used.

The first substrate may have heat resistance and chemical resistance enough to withstand a manufacturing step, and a material of the substrate is not particularly limited. For example, a glass substrate, a quartz substrate, a silicon substrate, a stainless steel substrate, or the like, or any one of these substrate over which an insulating film is provided can be used. In this embodiment mode, a glass substrate is used. Since the glass substrate having a large area can be manufactured, productivity can be improved. Further, a technique of manufacturing a semiconductor element (for example, a thin film transistor) over a glass substrate has almost been established, and a process with high versatility can be employed by using the glass substrate.

As a material for the semiconductor substrate 200, typically, silicon or germanium is used. Alternatively, a compound semiconductor such as gallium arsenide or indium phosphide may be used. Furthermore, the semiconductor substrate 200 is not limited to a single crystal semiconductor substrate, and may be a polycrystalline semiconductor substrate. In this embodiment mode, a single crystal silicon substrate is used. By using a single crystal substrate as a semiconductor substrate, a semiconductor substrate capable of high speed operation can be manufactured. Furthermore, by using a silicon substrate, a process with high versatility can be employed.

First, a separation layer 102 is formed over the first substrate 100 (see FIG. 1A-1). The separation layer 102 may be a single layer or stacked layers of a plurality of layers. In this embodiment mode, the separation layer 102 has a stacked-layer structure, in which a second separation layer 106 is formed over a first separation layer 104.

The separation layer 102 is formed in such a manner that a layer made of an element selected from tungsten, molybdenum, titanium, tantalum, niobium, nickel, cobalt, zirconium, zinc, ruthenium, rhodium, palladium, osmium, iridium, or silicon; an alloy material containing any of the elements described above as its main component; or a compound material containing any of the elements described above as its main component, is formed by a sputtering method, for example, to be a single layer or stacked layers. A crystalline structure of a layer including silicon may be any of an amorphous, microcrystalline, or polycrystalline structure.

When the separation layer 102 has a single layer structure, it is preferably formed using a layer containing tungsten, molybdenum, or a mixture of tungsten and molybdenum, or formed of a material including these. Alternatively, the separation layer 102 is formed of a material including oxide or oxynitride of tungsten; a material including oxide or oxynitride of molybdenum; or a material including oxide or oxynitride of a mixture of tungsten and molybdenum. It is to be noted that the mixture of tungsten and molybdenum is an alloy of tungsten and molybdenum, for example.

When the separation layer 102 has a stacked-layer structure, preferably, a metal layer is formed as a first layer, and a metal oxide layer is formed as a second layer. Typically, a tungsten layer, a molybdenum layer, or a layer containing a mixture of tungsten and molybdenum is formed as a first layer, and a layer containing oxide, nitride, oxynitride, or nitride oxide of tungsten, molybdenum, or a mixture of tungsten and molybdenum is formed as a second layer.

When the separation layer 102 has the stacked-layer structure in which a metal layer is formed as the first layer and a metal oxide layer is formed as the second layer, the stacked-layer structure may be formed by utilizing the following: a layer containing tungsten is formed as the metal layer of the first layer, and an insulating layer made of a metal oxide is formed thereover, whereby a layer containing an oxide of tungsten is formed as the metal oxide layer of the second layer at the interface between the layer containing tungsten and the insulating layer. Here, the insulating layer made of a metal oxide corresponds to the second separation layer 106. Additionally, a metal oxide layer may be formed by performance of thermal oxidation treatment, oxygen plasma treatment, treatment with a solution having strong oxidizing power such as ozone water, or the like to the surface of the metal layer. For example, a silicon oxide film may be formed over tungsten, and a tungsten oxide may be formed between the silicon oxide and the tungsten. However, since it is difficult for the tungsten oxide and the silicon oxide to be in contact with each other, although it is advantageous in terms of separation, there is a possibility that the tungsten oxide and the silicon oxide may be separated from each other in a manufacturing step without intention. On the other hand, when tungsten nitride is formed between the tungsten and the silicon oxide, although separation without intention in a manufacturing step can be prevented, there is a problem that it is difficult to perform separation. Therefore, a layer which is to be provided as the separation layer 102 may be set as appropriate depending on a manufacturing step.

Further, as the separation layer 102, a metal layer may be formed as the first layer, and a metal nitride layer or a metal oxynitride layer may be provided as the second layer. Typically, a layer that contains tungsten may be formed as the first layer, and then, a tungsten nitride layer or a tungsten oxynitride layer may be formed as the second layer.

The separation layer 102 may be formed to have a thickness with which an element is not damaged in a separation step and throughput is not reduced to excess. In this embodiment mode, a tungsten film with a film thickness of 30 nm is formed as the first separation layer 104, and a silicon oxide film with a film thickness of 250 nm is formed as the second separation layer 106. The first separation layer 104 and the second separation layer 106 can be formed by, for example, a sputtering method, a CVD method, or the like.

It is to be noted that when the tungsten film is formed as the first separation layer 104 and the silicon oxide film is formed as the second separation layer 106 by a CVD method, $N_2O$ plasma treatment is preferably performed just after the tungsten film as the first separation layer 104 is formed. By performing $N_2O$ plasma treatment, the tungsten oxide layer can be formed thick. By forming the tungsten oxide layer which is formed at the interface between the tungsten layer and the silicon oxide layer thick, adhesiveness required in a manufacturing step can be secured and separation can be preferably performed.

Then, the surface of the separation layer 102 is flattened. The surface of the separation layer 102 is uneven in many cases. Specifically, this is particularly remarkable when the separation layer 102 is formed by a sputtering method. When the surface is uneven, a contact area between bonding layers becomes small in the case where the bonding layers located on separate substrates are bonded in a later step; thus it is difficult to ensure enough bonding strength. Therefore, a step of flattening the surface of the separation layer is required.

The separation layer 102 may be flattened by a method by which an entire surface of the separation layer can be uniformly flattened. Furthermore, flattening of the layers is preferably performed in a simple step which can be performed in the same apparatus as the steps of forming the separation layer and forming the bonding layer. As such a step, a reverse sputtering method when the separation layer 102 is formed by a sputtering method, is given as an example. In this embodiment mode, flattening is performed by a reverse sputtering method. Note that the present invention is not limited to this, and there is no particular limitation on a processing method as far as flatness can be improved. As the process, a physical etching method or a chemical etching method can be used. However, when the separation layer is formed by a sputtering method, flattening is performed by a reverse sputtering method. Accordingly, steps of forming the separation layer and flattening the separation layer can be preformed in the same apparatus, and throughput is improved, which is preferable.

The reverse sputtering method is performed in a plasma sate by introducing an inert gas, an Ar gas, or the like into a high-vacuum chamber and applying an electric field to a surface to be processed. In plasma, an electron and a cation of Ar are present, and the cation of Ar is accelerated in a cathode direction. The surface to be processed is sputtered by the cation of Ar which is accelerated. At this time, a convex portion of the surface to be processed is preferentially sputtered and flattened.

Figures 1, 1A, 2:
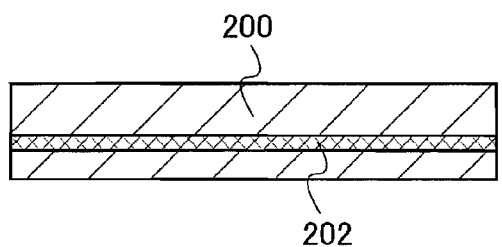
Figures 1, 1B:
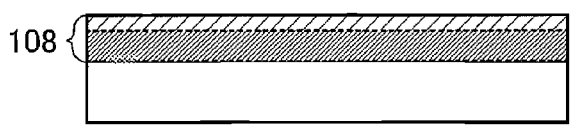
Figures 1, 1B, 2:
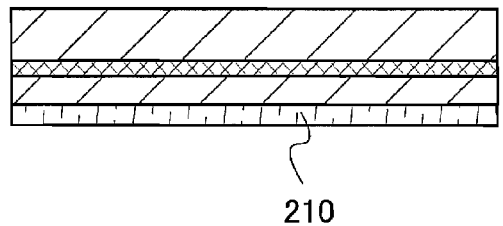

As described above, flatness of the separation layer is improved, and a flattened separation layer 108 can be formed by application of the present invention (see FIG. 1B-1). Furthermore, by application of the present invention, the separation layer can be formed and flattened successively and collectively in the same apparatus. Thus, throughput in a manufacturing step of a semiconductor device is improved, which is preferable.

Note that the present invention is not limited to the above description, and a tungsten film may be formed over a silicon oxide film or a tungsten film may be sandwiched between silicon oxide films.

Figures 1, 1C:
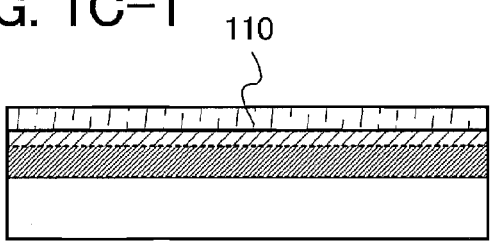

Subsequently, a first bonding layer 110 is formed over the flattened separation layer 108 (see FIG. 1C-1). Since the first bonding layer 110 is formed by a sputtering method, a CVD method, or the like, the surface of the first bonding layer 110 reflects the shape of the separation layer 108. The first bonding layer 110 is formed using a material with which the surface of the first bonding layer 110 has high flatness and hydrophilicity. A silicon oxide film may be used for the first bonding layer 110. In particular, a silicon oxide film formed by a chemical vapor deposition method using a silane-based gas such as a silane gas, a disilane gas, a trisilane gas, or an organosilane gas, is preferable. When the silane gas is used, a gas which is mixed with nitrogen dioxide or dinitrogen monoxide is preferably used. Examples of the organosilane gas include silicon-containing compounds, such as tetraethyl orthosilicate (TEOS, chemical formula: $Si(OC_2H_5)_4$), trimethylsilane (TMS, chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or tris-dimethylaminosilane (chemical formula: $SiH(N(CH_3)_2)_3$). As a chemical vapor deposition method, plasma CVD, thermal CVD, or photo CVD may be used. As the first bonding layer 110, a silicon nitride film, stacked layers in which a silicon nitride oxide film is stacked over a silicon nitride film, or stacked layers in which a silicon oxynitride film is stacked over a silicon nitride film may be used. Alternatively, an oxide film of aluminum may be used.

The first bonding layer 110, the surface of which has high flatness and hydrophilicity, may be provided at a thickness of from 5 nm to 500 nm. By forming the first bonding layer 110 to have the above thickness, even if the first bonding layer 110 is an insulating film being formed reflecting the shape of a base, influence of the shape of the base on bonding surfaces can be reduced. In addition, by forming the first bonding layer 110 thick, distortion caused between substrates which are to be bonded can be relieved.

In this embodiment mode, the flat separation layer 108 provided so as to be in contact with a bottom of the first bonding layer 110 is flattened by a reverse sputtering method or the like. Therefore, the first bonding layer 110 can be formed thin, specifically, with a thickness of from 5 nm to 50 nm. Since the first bonding layer 110 can be formed thin, throughput in a manufacturing step of a semiconductor device can be improved. However, when the first bonding layer 110 is formed with a film thickness of more than 50 nm, the present invention is applicable. There is a case where flatness of an outermost surface can not be sufficient even if the separation layer is formed thick. By application of the present invention to this case, the first bonding layer 110 and the second bonding layer 210 can be bonded firmly.

According to the present invention, regardless of the thickness of the bonding layers, separation between the bonding layers can be made hard to occur, and yield in a manufacturing step is improved. Furthermore, separation between the bonding layers is hard to occur, and a defect due to this can be reduced. As a result, a highly reliable semiconductor device can be manufactured.

A semiconductor substrate 200 is also processed while a thin film is formed over the first substrate 100 as described above.

A damaged area 202 is formed in a certain depth from a surface of the semiconductor substrate 200 (see FIG. 1A-2). The damaged area 202 is formed by introducing ions accelerated by an electric field from a cleaned surface of the semiconductor substrate 200 to a predetermined depth. The ions are introduced in consideration of a thickness of a single crystal semiconductor layer or a polycrystalline semiconductor layer (hereinafter referred to as a LTSS layer) formed over the first substrate 100 while adjusting an accelerating voltage or the like. A thickness of the LTSS layer is set to be from 5 nm to 500 nm, preferably 10 to 200 nm. The damaged area 202 is formed using hydrogen, an inert gas, or halogen. As an inert gas, helium is used, and as halogen, fluorine is used.

Since the ions are introduced at a high dose in the formation of the damaged area 202, the surface of the semiconductor substrate 200 is roughened in some cases. In order to prevent the surface roughness, a protective film may be provided on a surface to which ions are introduced. This protective film may be provided using a silicon oxide film, a silicon nitride film, a silicon nitride oxide film, or the like with a thickness of from 0.5 nm to 200 nm.

The condition of the high dose is set as appropriate by an operator of the invention depending on the purpose. In accordance with the condition of the dose, a depth from the surface of the semiconductor substrate at which the damaged area 202 is formed is determined. For example, when accelerating voltage is set to 60 kV, and the dose is set to $2.0\times10^{16}$ $cm^{-2}$, the damaged area 202 is formed in a position at a depth of about 150 nm from the surface of the semiconductor substrate.

Then, a second bonding layer 210 is formed on a surface which forms a bond with the first substrate (see FIG. 1B-2). The second bonding layer 210 is preferably formed using an insulating film including silicon, specifically, a silicon oxide film. The silicon oxide film is preferably formed by a chemical vapor deposition method using an organosilane gas as described above. A silicon oxide film formed by a chemical vapor deposition method using a silane-based gas such as a silane gas, a disilane gas, or a trisilane gas may be used. In the film formation by a chemical vapor deposition method, a film formation temperature, (for example, 350° C. or lower) at which degassing of the damaged area 202 formed in the semiconductor substrate 200 does not occur, is employed. In addition, the heat treatment for separating the LTSS layer from a single crystal semiconductor substrate or polycrystalline substrate is carried out at a temperature higher than the film formation temperature.

As a chemical vapor deposition method, a plasma CVD method, a thermal CVD method, or a photo CVD may be used. In particular, by a plasma CVD method using TEOS and $O_2$, or a thermal CVD method using $SiH_4$ and $NO_2$, a flat silicon oxide film which is suitable for a bonding layer can be formed at a low temperature (350° C. or lower), which is preferable.

A silicon oxide film to be the second bonding layer 210 can be formed using a chemical solution including ozone water and hydrogen peroxide or using ozone water. In that case, the thickness may be from 0.5 nm to 5 nm. Further, the second bonding layer 210 may be a semiconductor surface which is terminated with hydrogen or fluorine. Alternatively, a silicon oxide film to be the second bonding layer 210 can be formed using a chemical solution including hydrochloric acid. As such a chemical solution, dichloroethylene is given as an example.

However, if the bonding strength between the first bonding layer 110 and the semiconductor substrate 200 is sufficient, the second bonding layer 210 is not necessarily formed, and the first bonding layer 110 and the semiconductor substrate 200 may be directly bonded.

Similarly, if the bonding strength between the flat separation layer 108 and the second bonding layer 210 is sufficient, the first bonding layer 110 is not necessarily formed, and the flat separation layer 108 and the second bonding layer 210 may be directly bonded.

That is, in the case where there is no problem in bonding strength, a bonding layer is not necessarily formed on the both first substrate 100 and the semiconductor substrate 200. By not forming the bonding layer, throughput in a manufacturing step of a semiconductor device can be improved.

Figure 1D:
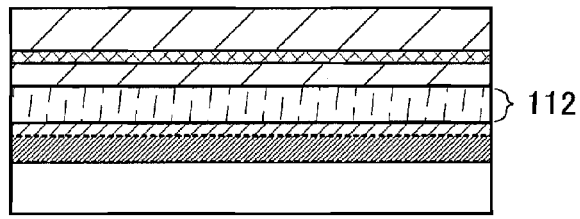

Subsequently, the first bonding layer 110 formed on the first substrate 100 and the second bonding layer 210 formed on the semiconductor substrate 200 are disposed in close contact and bonded to each other (see FIG. 1D). Accordingly, a third bonding layer 112 is formed. By disposing the first bonding layer 110 and the second bonding layer 210 in close contact with each other, they can be bonded at a room temperature. In order to form a stronger bond, pressure may be applied in a direction perpendicular to the bonding surfaces of the first substrate 100 and the semiconductor substrate 200. Furthermore, heat treatment is preferably performed. The heat treatment may be performed under pressure. By performing the heat treatment under pressure, the first bonding layer 110 and the second bonding layer 210 are bonded strongly. Thus, separation between the bonding layers can be reduced, and yield is improved. Furthermore, reliability of the obtained semiconductor device is improved.

To bond the surfaces to be bonded, which are formed from different kinds of materials, to each other at low temperature, the surfaces may be cleaned. When the first bonding layer 110 and the second bonding layer 210, the surfaces of which are cleaned, are disposed in close contact with each other, the third bonding layer 112 is formed by attractive force between the surfaces. In order to make the cleaned surfaces to be hydrophilic surfaces, a plurality of hydroxyl groups may be attached. For example, by performing oxygen plasma treatment or ozone treatment to the surfaces of the first bonding layer 110 and the second bonding layer 210, the surfaces can be made hydrophilic. By adding the treatment by which the surfaces are made hydrophilic in this manner, the hydroxyl groups on the surfaces act to form hydrogen bonding and a strong bond can be formed.

Furthermore, to form favorable bonding, the surfaces to be bonded may be activated. For example, the surfaces to be bonded are irradiated with an atomic beam or an ion beam. In the case where an atomic beam or an ion beam is utilized, an inert gas neutral atom beam or inert gas ion beam of argon or the like can be used. Specifically, by the irradiation with an ion beam, a dangling bond is exposed on a surface of the first bonding layer 110 or the second bonding layer 210 and extremely active surfaces are formed. Alternatively, plasma irradiation or radical treatment may be performed on the surfaces to be bonded. By performing such surface treatment, even if the first bonding layer 110 and the second bonding layer 210 are formed from different kinds of materials, the third bonding layer 112 can be easily formed at a temperature approximately from 200° C. to 400° C. In the method of forming a bond by activating surfaces, since it is required to keep the surfaces in a highly cleaned state, the method is preferably carried out in vacuum, more preferably, in high vacuum.

In order to enhance the bonding strength of the third bonding layer 112, heat treatment or pressure treatment is preferably performed after the bonding is performed. Specifically, when the third bonding layer 112 is bonded at a room temperature, heat treatment is preferably performed after the bonding is performed. By performing the heat treatment or pressure treatment, a main bond which contributes to bonding at the bonding surfaces is changed from a hydrogen bond into a covalent bond, and the bonding strength is improved. The heat treatment is performed at a temperature equal to or lower than the upper temperature limit of the first substrate 100. In the pressure treatment, pressure is applied in a direction perpendicular to the bonding surfaces. The pressure to be applied is determined in consideration of mechanical strength of the first substrate 100 and the semiconductor substrate 200, or the like.

Figure 1E:
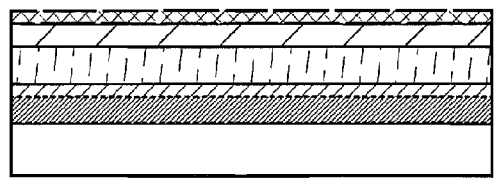

Then, heat treatment is performed to the first substrate 100 to which the semiconductor substrate 200 is bonded, and the semiconductor substrate 200 is separated from the first substrate 100 using a given position in the damaged area 202 as a cleavage plane (see FIG. 1E). A physical means may be used for separation. Furthermore, heat treatment is preferably performed at equal to or high than the film formation temperature of the first bonding layer 110 and the second bonding layer 210, and equal to or lower than the upper temperature limit of the first substrate 100. By performing the heat treatment at, for example, from 400° C. to 600° C., volume of minute voids formed in the damaged area 202 is changed, which enables cleavage to occur along the damaged area 202. Because the third bonding layer 112 is bonded to the first substrate 100, the LTSS layer having the same crystallinity as the semiconductor substrate 200 is left on the first substrate 100.

Note that the physical means in this case refers to a dynamic means or a mechanical means, which changes some sort of dynamic energy (mechanical energy). Typically, the physical means is an action of applying mechanical force (e.g., a peeling process with a human hand or with a gripper, or a separation process by rotating a roller).

Figure 1F:
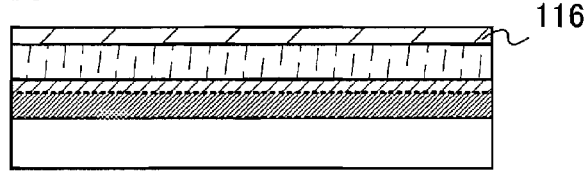
Figures 1, 3A:
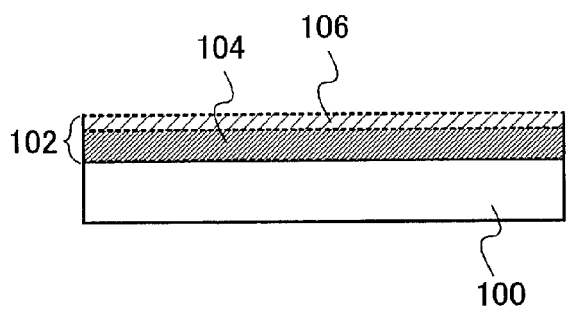
Figures 2, 3A:
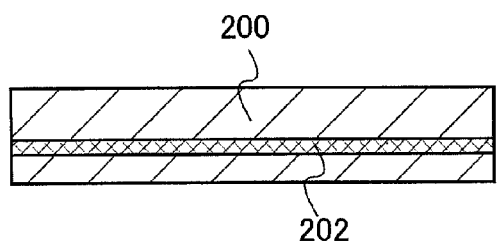
Figures 1, 3B:
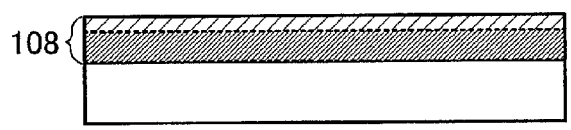
Figures 1, 3C:
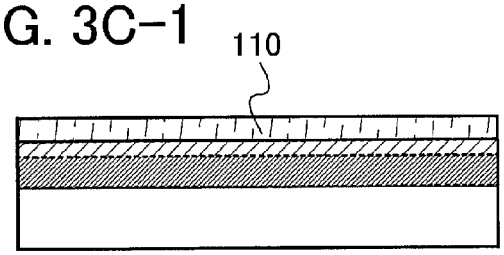
Figure 3D:
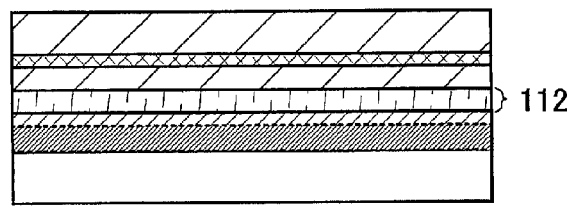
Figure 3E:
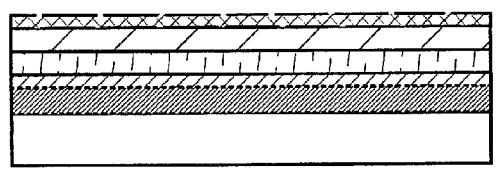
Figure 3F:
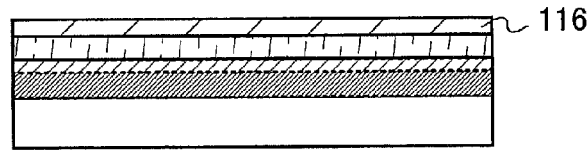

An LTSS layer 116 is preferably thinned and flattened by chemical mechanical polishing (CMP) or the like after the above separation process (see FIG. 1F). For example, the LTSS layer 116 can be formed by an ion implantation separation method as follows: introducing ions of hydrogen, an inert gas typified by helium, or halogen typified by fluorine into a predetermined depth of the single crystal semiconductor substrate; performing heat treatment; and separating a single crystal silicon layer which is a surface layer. Alternatively, a method may be used in which after single crystal silicon is epitaxially grown over porous silicon, cleavage is performed by water-jetting so that a porous silicon layer is separated. The thickness of the LTSS layer 116 is set at from 5 nm to 500 nm, preferably, from 10 nm to 200 nm. However, the present invention is not limited to this, and the LTSS layer may be thinned and flattened by a reverse sputtering method, or by both CMP and a reverse sputtering method.

Before the semiconductor substrate 200 is separated using the damaged area 202 as a cleavage plane, a trigger may be made so that separation can be performed easily. Moreover, when the semiconductor substrate 200 is separated, separation can be performed more easily if an adhesive sheet which can be separated by light or heat is provided on at least one of the surfaces of the first substrate 100 and the semiconductor substrate 200, one of the first substrate 100 and the semiconductor substrate 200 is fixed, and the other is separated. At that time, by provision of a supporting member for the surface of at least one of the first substrate 100 or the semiconductor substrate 200, the surface of which is not a bonding surface, separation can be easily performed.

Although not shown in the drawings, a barrier layer may be provided between the LTSS layer 116 and the third bonding layer 112. The barrier layer may be provided using a film formed of a material which can prevent the LTSS layer 116 from being contaminated by a mobile ion impurity like alkali metal or alkaline earth metal that is diffused from a glass substrate used as the first substrate 100. Furthermore, diffusion of an impurity from the separation layer can also be prevented. As the barrier layer, for example, an insulating layer including nitrogen can be used. As the insulating layer including nitrogen, a single layer or stacked layers of a silicon nitride film, a silicon nitride oxide film, or a silicon oxynitride film can be used. For example, by stacking a silicon oxynitride film and a silicon nitride oxide film from the LTSS layer 116 side, the barrier layer made of the insulating layer including nitrogen can be provided.

Note that a silicon oxynitride film means a film that contains more oxygen than nitrogen and, preferably, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, preferably, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

It is to be noted that the present invention is not limited to the above-described structure. Not shown in the drawings, the first bonding layer 110 is not necessarily formed (see FIGS. 2A-1, 2B-1, 2A-2, 2B-2 and 2C to 2E). Furthermore, the second bonding layer 210 is not necessarily formed (see FIGS. 3A-1 to 3C-1, 3A-2 and 3D to 3F). The case where the bonding layer is not necessary means a case where a bonding surface and a surface to be bonded are bonded preferably without forming the bonding layer. By forming one of the first bonding layer 110 and the second bonding layer 210, or not forming both of the first bonding layer 110 and the second bonding layer 210, a manufacturing step is reduced and throughput is improved.

As described above, a flat separation layer can be obtained in accordance with the present invention. Therefore, the surface of a bonding layer can be flattened. As a result, an SOI structure can be formed over a flexible substrate. Further, a semiconductor device formed over the flexible substrate can be manufactured at a high yield. Furthermore, reliability of the semiconductor device capable of high speed operation can be improved.

Embodiment Mode 2

The present invention is not limited to the modes described in Embodiment Mode 1, and for example, a separation layer may be formed over a semiconductor substrate. Such a mode will be described hereinafter. Note that a repeated explanation will be omitted.

FIGS. 4A-1, 4A-2 to 4C-2 and 4D to 4F show an example of a mode for forming a separation layer over a semiconductor substrate.

Figures 2, 4A:
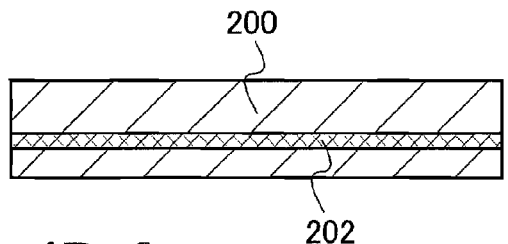
Figures 1, 4A:
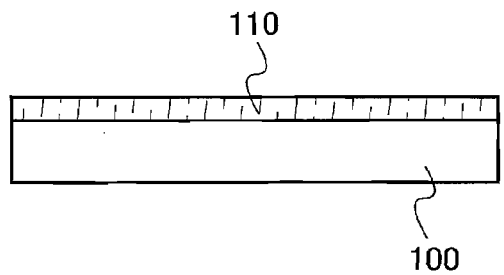

First, a damaged area 202 is formed by introducing ions into a semiconductor substrate 200 in a similar manner to Embodiment Mode 1 (see FIG. 4A-2).

Figures 2, 4B:
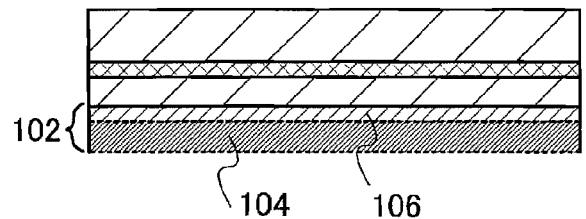
Figures 2, 4C:
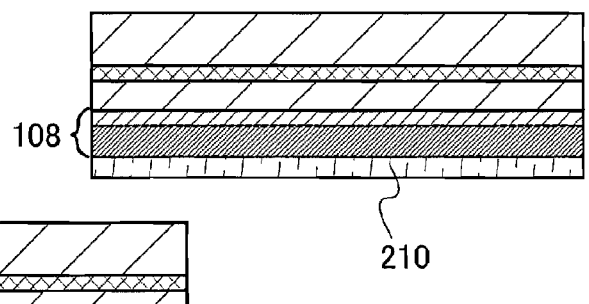
Figure 4D:
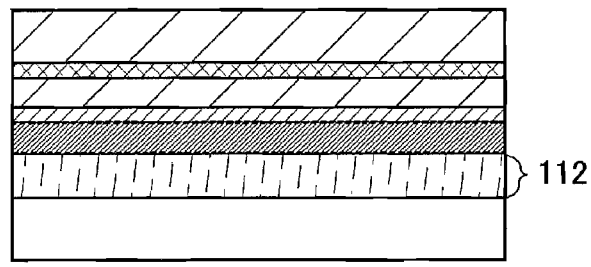

Then, a separation layer 102 is formed over the semiconductor substrate 200 in which the damaged area 202 is formed in a similar manner to Embodiment Mode 1 (see FIG. 4B-2).

Then, the separation layer 102 is flattened to form a second bonding layer 210 over a flat separation layer 108. Note that the separation layer 102 is preferably flattened by a reverse sputtering method (see FIG. 4C-2).

A first bonding layer 110 is formed over a first substrate 100 in a similar manner to Embodiment Mode 1 while the semiconductor substrate 200 is processed (see FIG. 4A-1).

The thus processed first substrate 100 is bonded to the semiconductor substrate 200. That is, similarly to Embodiment Mode 1, the first bonding layer 110 and the second bonding layer 210 are bonded, whereby a third bonding layer 112 can be formed (see FIG. 4D).

Figure 4E:
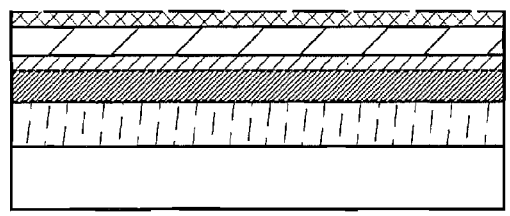
Figure 4F:
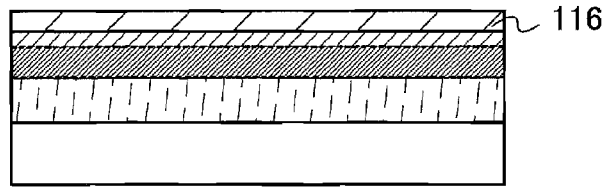
Figures 2, 5A:
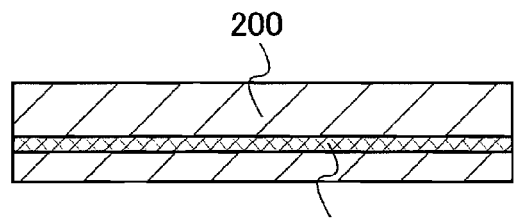
Figures 1, 5A:
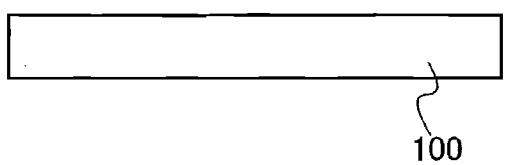
Figures 2, 5B:
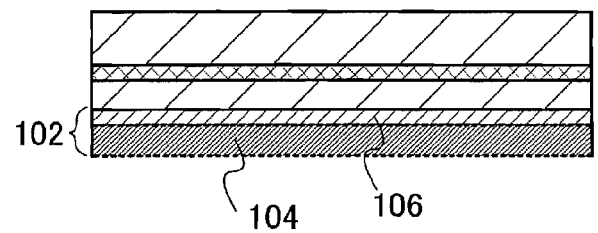
Figures 2, 5C:
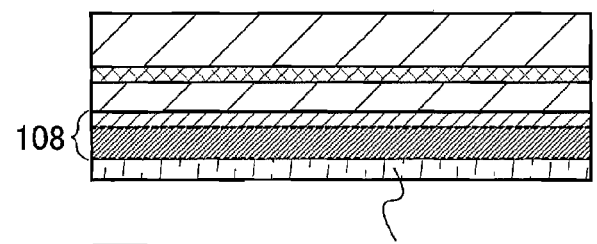
Figure 5D:
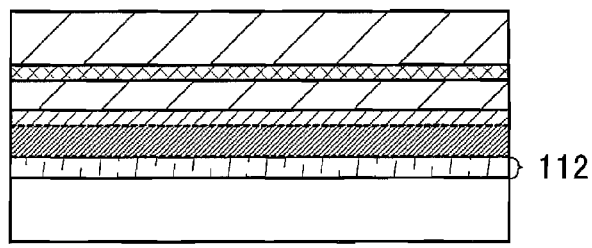
Figure 5E:
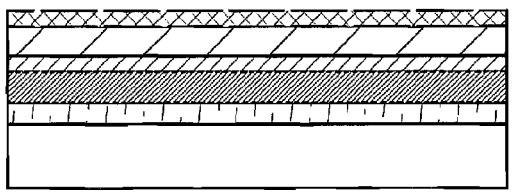
Figure 5F:
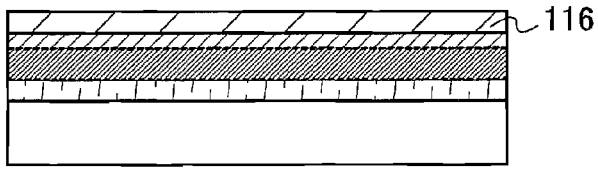
Figures 2, 6A:
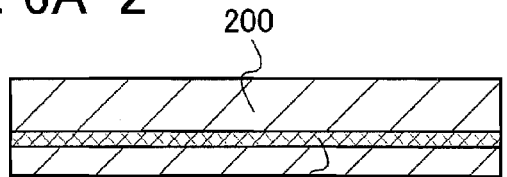
Figures 2, 6B:
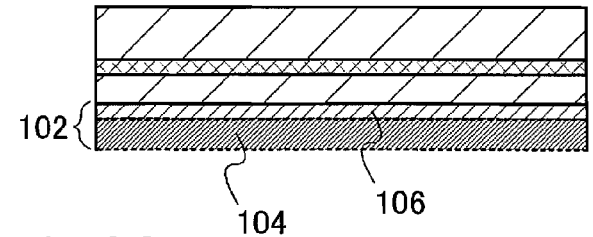
Figures 1, 6A:
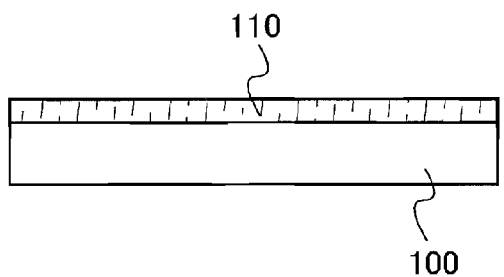
Figures 2, 6C:
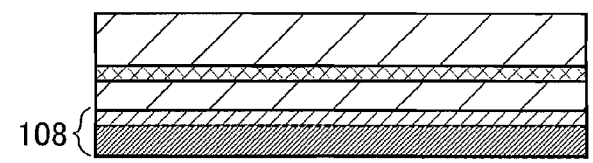
Figure 6D:
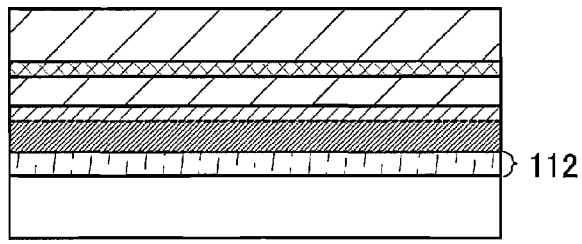
Figure 6E:
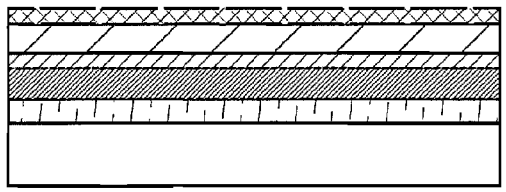
Figure 6F:
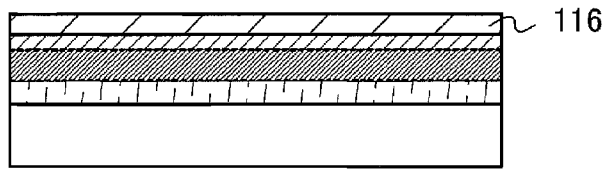

Subsequently, the semiconductor substrate 200 is separated at the damaged area, thereby forming a semiconductor layer over the first substrate 100 (see FIG. 4E). Further, the semiconductor layer is flattened, whereby an LTSS layer 116 is formed.

It is to be noted that the present invention is not limited to the above description. The first bonding layer 110 is not necessarily formed (see FIGS. 5A-1, 5A-2 to 5C-2 and 5D to 5F). Furthermore, the second bonding layer 210 is not necessarily formed (see FIGS. 6A-1, 6A-2 to 6C-2, and 6D to 6F). The case where the bonding layer is not necessary means a case where a bonding surface and a surface to be bonded are bonded preferably. By forming one of the first bonding layer 110 and the second bonding layer 210, or not forming both of the first bonding layer 110 and the second bonding layer 210, a manufacturing step is reduced and throughput is improved.

As described in this embodiment mode, the present invention can be implemented.

Embodiment Mode 3

As described in Embodiment Mode 1 and Embodiment Mode 2, an SOI substrate is manufactured and a semiconductor substrate using the SOI substrate can be manufactured. In this embodiment mode, a method for manufacturing a thin film integrated circuit manufactured using the present invention is described in detail with reference to drawings.

Figure 7A:
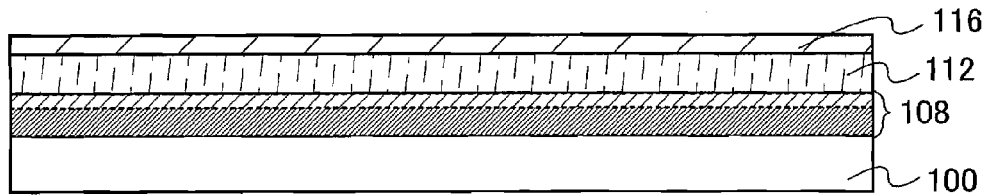
FIGS. 7A to 7D illustrate an example of a method for manufacturing a transistor in which an SOI substrate of the present invention is used.
Figure 7B:
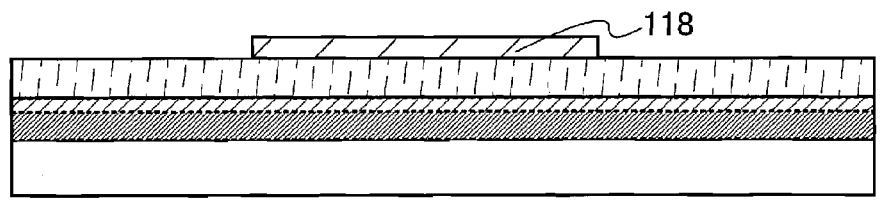

FIG. 7A shows an SOI substrate manufactured as described in Embodiment Mode 1 or Embodiment Mode 2. First, the LTSS layer 116 of the SOI substrate is formed to have a desired shape by patterning (see FIG. 7B). A resist mask is used for forming a pattern. The LTSS layer 116 is etched with the resist mask having a desired pattern. At this time, etching may be performed under conditions in which an etching rate with respect to the LTSS layer is high and an etching rate with respect to the third bonding layer 112 is low, and either of dry etching or wet etching is selected.

Figure 7C:
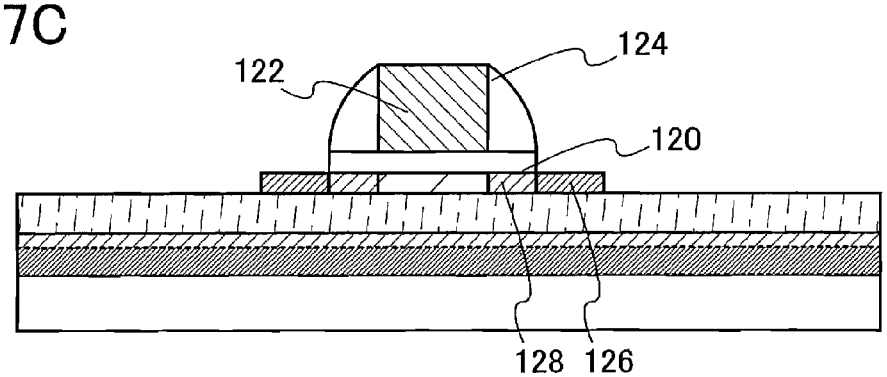

Then, a gate insulating film 120, a gate electrode layer 122, and side walls 124 are sequentially formed, and a source region and a drain region 126 and an LDD region 128 are formed in an LTSS layer 118 (see FIG. 7C).

The gate insulating film 120 is formed of silicon oxide, silicon nitride, silicon oxynitride, silicon nitride oxide, or the like. A CVD method, a sputtering method, a plasma CVD method, or the like is used for the formation. The film thickness may be set at from 5 nm to 200 nm. The structure of the gate insulating film 120 is not limited to the one shown in the drawings, and the gate insulating film 120 may be formed over the entire surface.

The gate electrode layer 122 can be formed by a CVD method, a sputtering method, a droplet discharging method, or the like. The gate electrode layer 122 may be formed of an element selected from tantalum, tungsten, titanium, molybdenum, aluminum, or copper, or an alloy material or a compound material containing such an element as a main component. In the case of using aluminum for the gate electrode layer 122, hillocks are suppressed by using an Al—Ta alloy in which aluminum is alloyed with tantalum added thereto. In addition, in the case of using an Al—Nd alloy in which aluminum is alloyed with neodymium added thereto, hillocks are suppressed, and also a wiring with low resistance can be formed. Therefore, an Al—Ta alloy or an Al—Nd alloy is preferably used. Alternatively, a semiconductor film typified by polycrystalline silicon doped with an impurity element such as phosphorus, or an AgPdCu alloy may be used. The gate electrode layer 122 may be a single layer or stacked layers. For example, a stacked-layer structure including two layers of a titanium nitride film and a molybdenum film, or a stacked-layer structure including three layers of a tungsten film having a thickness of 50 nm, an alloy film of aluminum and silicon having a thickness of 500 nm, and a titanium nitride film having a thickness of 30 nm may be used. Also, in the case of the stacked-layer structure including three layers, a tungsten nitride film may be used as a first conductive film instead of the tungsten film, an alloy film of aluminum and titanium may be used as a second conductive film instead of the alloy film of aluminum and silicon, and a titanium film may be used as a third conductive film instead of the titanium nitride film. The gate electrode layer 122 may be a single layer or stacked layers. For example, the gate electrode layer 122 may be formed of a film including molybdenum as its main component.

On side surfaces of the gate electrode layer 122, the side walls 124 are provided. The formation of the side walls 124 is performed by forming an insulating film over the entire surface and etching the insulating film selectively by anisotropic etching. Note that the kind of the insulating film is the same as the gate insulating film 120.

The source region and the drain region 126, and the LDD region 128 are formed by adding an impurity element imparting one conductivity type. The source region and the drain region 126 are high-concentration impurity regions, to which an impurity imparting one conductivity type is added at a high concentration, and the LDD region 128 is a low-concentration impurity region, to which an impurity imparting one conductivity type is added at a low concentration. To separately form the regions having different concentrations of impurities, the low-concentration impurity region may be formed by doping an impurity through an insulating film (here, the side walls 124), and the high-concentration impurity region may be formed by doping an impurity in a state where a semiconductor film is exposed. Alternatively, an impurity may be introduced into both of a region to be the low-concentration impurity region and a region to be the high-concentration impurity region at a low concentration, and then, an impurity may be introduced only into the region to be high-concentration impurity region at a high concentration. Note that an LDD region is a region that is formed with a purpose of improving reliability in a TFT in which a semiconductor layer is formed of a polycrystalline silicon film. In a TFT in which a semiconductor layer is made of polycrystalline silicon, it is important to suppress an off current, and it is particularly necessary that the off current is sufficiently low when the TFT is used for an analog switch such as a pixel circuit. However, leak current flows through a defect even when the TFT is off, due to a reverse-bias intense electric field at a drain junction portion. By the formation of the LDD region, an electric field in a vicinity of a drain edge is relaxed, whereby the off current can be reduced. Moreover, the reverse-bias electric field at the drain junction portion can be diffused to a junction portion between a channel forming region and the LDD region, and a junction portion between the LDD region and a drain region; consequently, the electric field is relaxed, and the leak current is reduced. By performing annealing thereafter, the impurity may be activated.

Figure 7D:
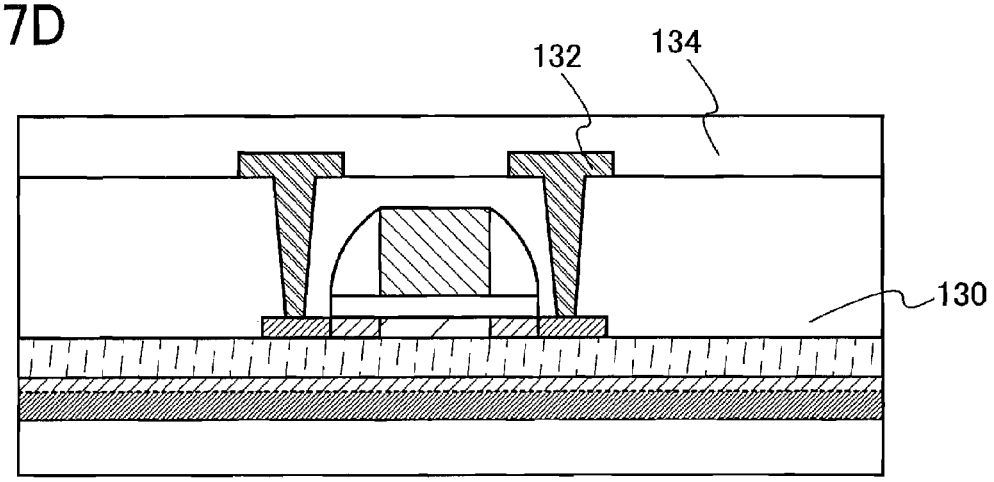

Then, an insulating film 130 is formed, and an opening portion is formed in a desired position. A source electrode and a drain electrode are formed so as to connect to the source region and the drain region 126 of the LTSS layer 118. Thereafter, an insulating film 134 is formed (see FIG. 7D). The insulating film 134 is not necessarily formed when it is not necessary. The insulating film 130 is selectively formed. The insulating film 130 may be formed by a spin coating method or the like using a film made of an organic material typified by polyimide, acrylic, or the like. In forming a pattern, an opening portion is formed so that the source region and the drain region 126 are exposed. Note that the insulating film 130 may be formed by forming a film made of an organic material over a film made of an inorganic material such as a silicon oxide film, silicon nitride film, silicon oxynitride film, silicon nitride oxide film, or the like. That is, the insulating film 130 may have a stacked-layer structure. Alternatively, the insulating film 130 may be formed only by these inorganic materials.

In accordance with the above-described steps, a thin film transistor can be manufactured. Then, a thin film integrated circuit formed using the thin film transistor is transferred to a flexible substrate.

Figure 8A:
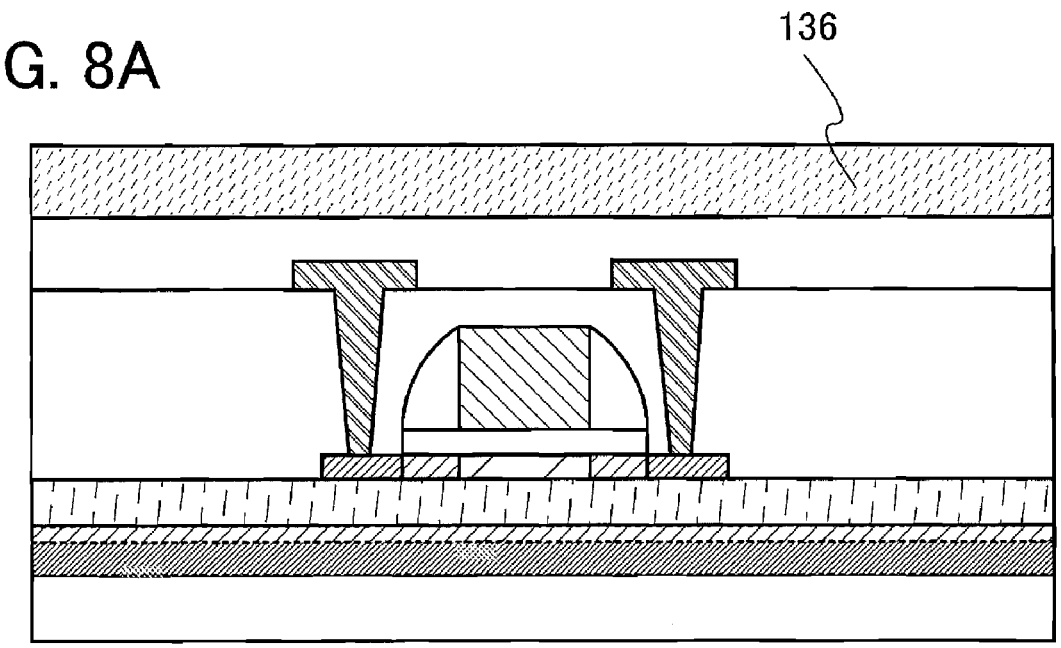
FIGS. 8A and 8B illustrate an example of a method for manufacturing a transistor in which an SOI substrate of the present invention is used.

First, the insulating film 134 is bonded to a flexible substrate 136 (see FIG. 8A). Examples of the flexible substrate include plastic substrates made of polyethylene terephthalate (PET), polyethylenenaphthalate (PEN), polyethersulfone (PES), polypropylene, polypropylene sulfide, polycarbonate, polyetherimide, polyphenylene sulfide, polyphenylene oxide, polysulfone, polyphthalamide, and the like and paper made of a fibrous material.

As the flexible substrate, a prepreg may be used. By using the prepreg for the flexible insulating substrate, damage caused by a point pressure or a linear pressure to the SOI substrate and a semiconductor device to be manufactured later can be prevented. A typical example of the prepreg can be given as follows: a fiber body such as polyvinyl alcoholic fiber, polyester fiber, polyamide fiber, polyethylene fiber, aramid fiber, polyparaphenylenebenzobisoxazole fiber, glass fiber, or carbon fiber is impregnated with a varnish which is obtained by diluting a matrix resin such as an epoxy resin, an unsaturated polyester resin, a polyimide resin, or a fluorine resin with an organic solvent, and then the matrix resin is half-cured by volatilizing the organic solvent by drying.

As the flexible substrate, a glass substrate of any of different types of glass used in the electronics industry such as aluminosilicate glass, aluminoborosilicate glass, barium borosilicate glass, and the like, which is made thin, can be used.

Figure 8B:
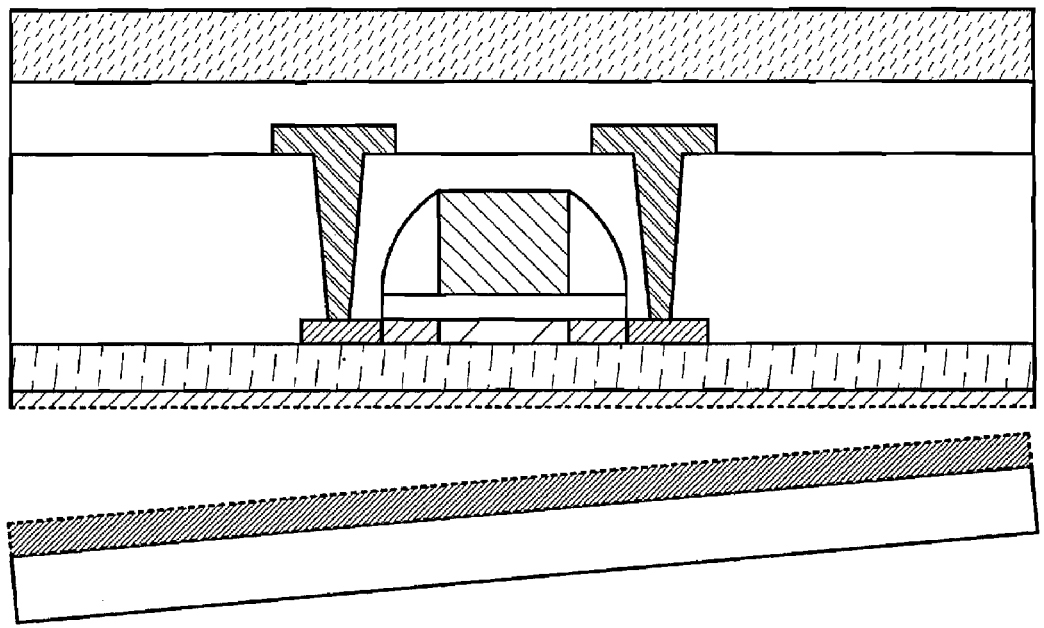

The thin film integrated circuit is separated from the first substrate 100 using the flat separation layer 108 as a trigger (see FIG. 8B). The separation may be performed using heat treatment, wet etching, or the like depending on the material of the separation layer.

As described above, a semiconductor device provided over the flexible substrate can be manufactured; however, the present invention is just one example. That is, the present invention is not limited to this embodiment mode, and can be applied to various transistors manufactured using an SOI substrate which is described in Embodiment Mode 1 or Embodiment Mode 2.

Embodiment Mode 4

Figure 9:
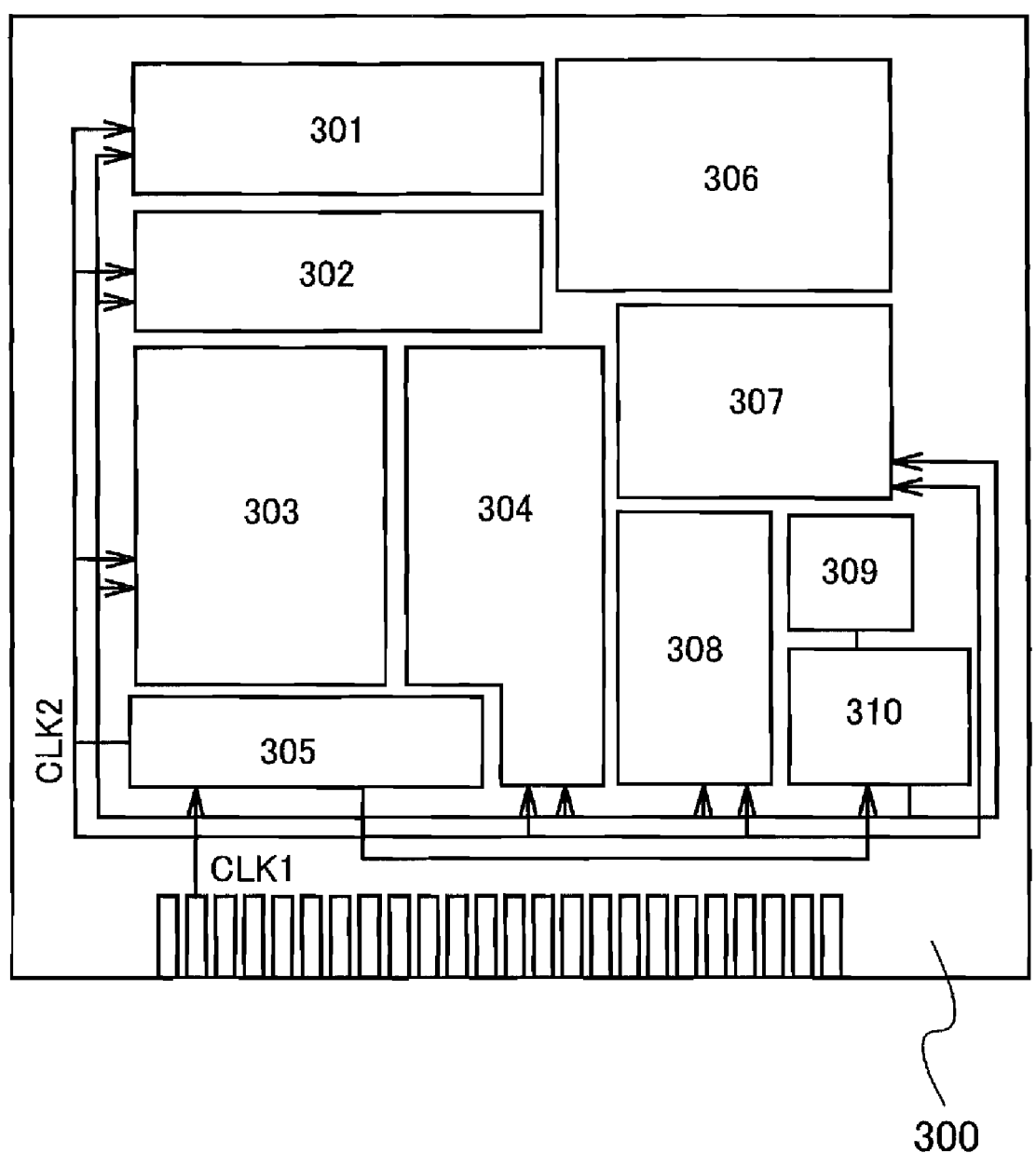
FIG. 9 illustrates an example of a semiconductor device in which an SOI substrate of the present invention is used.

As an example of a semiconductor device manufactured using an SOI substrate that is manufactured by application of Embodiment Mode 1 or Embodiment Mode 2, a microprocessor 300 is illustrated in FIG. 9. The microprocessor 300 includes an arithmetic logic unit (also referred to as ALU) 301, an ALU controller 302, an instruction decoder 303, an interrupt controller 304, a timing controller 305, a register 306, a register controller 307, a bus interface (Bus I/F) 308, a read only memory (ROM) 309, and a ROM interface (ROM I/F) 310.

An instruction inputted to the microprocessor via the bus interface 308 is inputted to the instruction decoder 303 and decoded. Then, the instruction is inputted to the ALU controller 302, the interrupt controller 304, the register controller 307, and the timing controller 305. The ALU controller 302, the interrupt controller 304, the register controller 307, and the timing controller 305 perform various controls based on the decoded instruction. Specifically, the ALU controller 302 generates a signal for controlling the operation of the arithmetic logic unit 301. The interrupt controller 304 determines an interrupt request from an external input/output device or a peripheral circuit based on its priority, a mask state, or the like, and processes the request while a program of the microprocessor 300 is executed. The register controller 307 generates an address of the register 306, and reads/writes data from/to the register 306 in accordance with the state of the microprocessor 300. The timing controller 305 generates signals for controlling timing of operation of the arithmetic logic unit 301, the ALU controller 302, the instruction decoder 303, the interrupt controller 304, and the register controller 307. For example, the timing controller 305 is provided with an internal clock generator for generating an internal clock signal CLK2 based on a reference clock signal CLK1, and supplies the clock signal CLK2 to each of the above-mentioned circuits. It is to be noted that the microprocessor 300 illustrated in FIG. 9 is just an example of the simplified structure, and practical microprocessors have various structures depending on usage.

The above-described microprocessor 300 can achieve not only an increase in processing speed but also a reduction in power consumption because an integrated circuit is formed using a single crystal semiconductor layer (an LTSS layer) whose crystal orientation is substantially uniform and which is bonded to a flexible substrate having an insulating surface.

Figure 10:
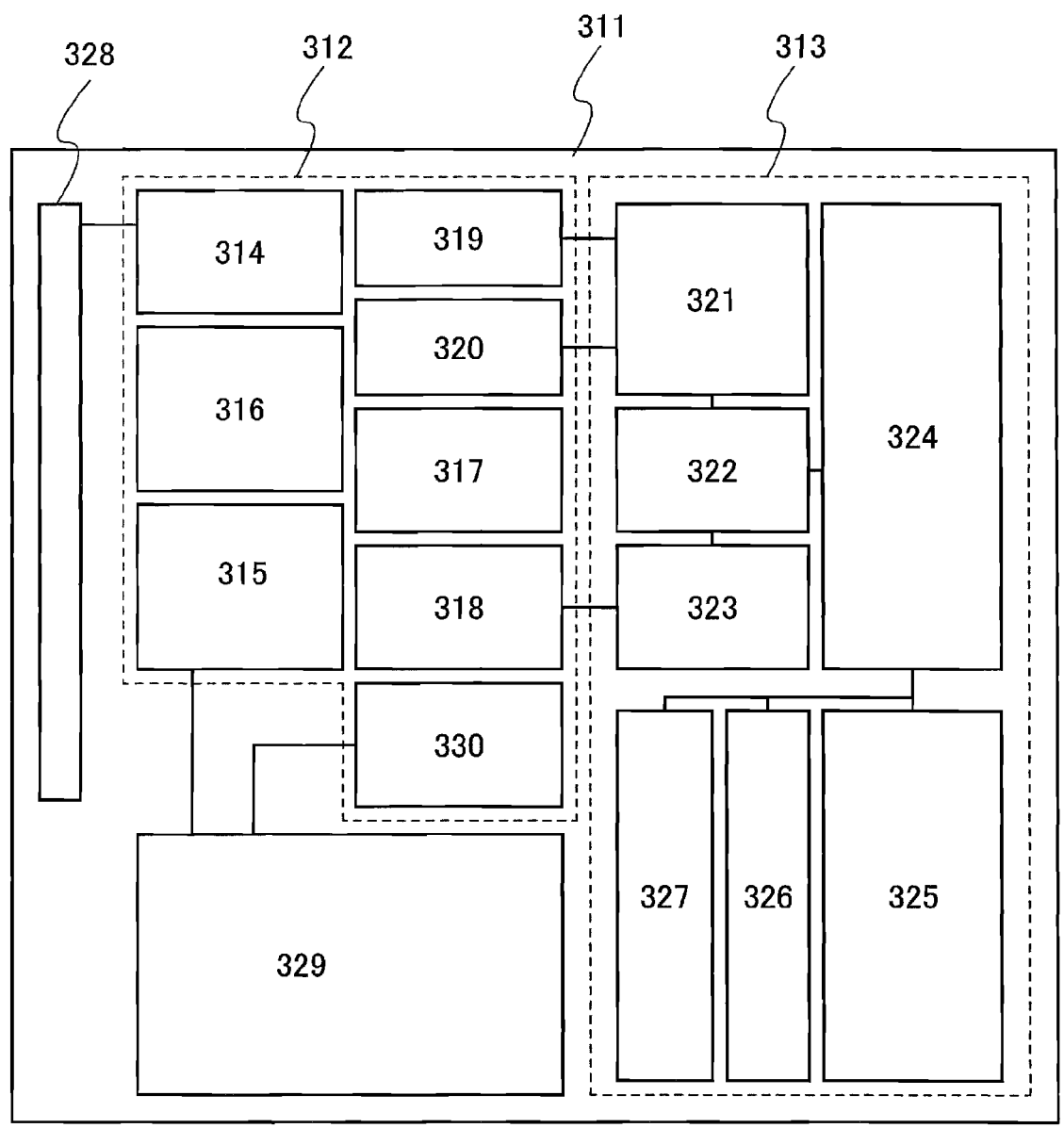
FIG. 10 illustrates an example of a semiconductor device in which an SOI substrate of the present invention is used.

Next, an example of a semiconductor device provided with an arithmetic function by which data can be transmitted/received without contact will be described with reference to FIG. 10. FIG. 10 shows an example of a computer that operates to transmit and receive signals to and from an external device by wireless communication (such a computer is hereinafter referred to as an RFCPU). The RFCPU 311 includes an analog circuit portion 312 and a digital circuit portion 313. The analog circuit portion 312 includes a resonance circuit 314 with a resonance capacitor, a rectifier circuit 315, a constant voltage circuit 316, a reset circuit 317, an oscillator circuit 318, a demodulator circuit 319, a modulator circuit 320. The digital circuit portion 313 includes an RF interface 321, a control register 322, a clock controller 323, a CPU interface 324, a CPU 325, a RAM 326, and a ROM 327.

The operation of the RFCPU 311 having such a structure is roughly described below. A signal received at an antenna 328 causes induced electromotive force at the resonant circuit 314. The induced electromotive force is stored in a capacitor portion 329 via the rectifier circuit 315. The capacitor portion 329 is preferably formed using a capacitor such as a ceramic capacitor or an electric double layer capacitor. The capacitor portion 329 is not necessarily formed over the same substrate as the RFCPU 311 and may be attached as another component to a substrate having an insulating surface that partially constitutes the RFCPU 311.

The reset circuit 317 generates a signal that resets the digital circuit portion 313 to be initialized. For example, the reset circuit 317 generates, as a reset signal, a signal that rises with delay after increase in the power supply voltage. The oscillation circuit 318 changes the frequency and the duty ratio of a clock signal in accordance with a control signal generated by the constant voltage circuit 316. The demodulation circuit 319 having a low pass filter, for example, binarizes changes in amplitude of reception signals of an amplitude shift keying (ASK) system. The modulation circuit 320 transmits transmission data by changing the amplitude of transmission signals of an amplitude shift keying (ASK) system. The modulation circuit 320 changes the resonance point of the resonance circuit 314, thereby changing the amplitude of communication signals. The clock controller 323 generates a control signal for changing the frequency and the duty ratio of the clock signal in accordance with a power supply voltage or the like. The power supply voltage is monitored by a power supply control circuit 330.

A signal that is inputted to the RFCPU 311 from the antenna 328 is demodulated by the demodulation circuit 319, and then divided into a control command, data, and the like by the RF interface 321. The control command is stored in the control register 322. The control command includes, reading of data stored in the ROM 327, writing of data to the RAM 326, an arithmetic instruction to the CPU 325, and the like. The CPU 325 accesses the ROM 327, the RAM 326, and the control register 322 via the CPU interface 324. The CPU interface 324 has a function of generating an access signal for any of the ROM 327, the RAM 326, and the control register 322 based on an address requested by the CPU 325.

As the operation of the CPU 325, a method may be employed in which the ROM 327 stores an OS (operating system) and a program is read out and executed at the time of starting operation. Alternatively, a method may be employed in which a dedicated arithmetic circuit is provided and arithmetic processing is conducted using hardware. In a method in which both hardware and software are used, a method can be used in which a part of process is conducted in a dedicated arithmetic circuit and the other part of the arithmetic process is conducted by the CPU 325 using a program.

The above-described RFCPU 311 can achieve not only an increase in processing speed but also a reduction in power consumption because an integrated circuit is formed using a single crystal semiconductor layer (an LTSS layer) whose crystal orientation is substantially uniform and which is bonded to a flexible substrate having an insulating surface as described in the above embodiment modes. Therefore, it is possible to ensure long-term operation even when the capacitor portion 329 which supplies electric power is downsized.

The semiconductor device using an SOI substrate that is manufactured by application of the present invention has high mobility since a single crystal semiconductor layer (an LTSS layers) whose crystal orientation is substantially uniform are used, and thus can operate at a high speed. Furthermore, as well as operating at a high speed, the semiconductor device has high reliability. Moreover, by the application of the present invention, the semiconductor device can be manufactured at a high yield.

As described above, a microprocessor and a RFCPU can be manufactured using an SOI substrate according to the present invention. However, this embodiment mode is just one example. That is, the present invention is not limited to this embodiment mode, and can be applied to various semiconductor devices manufactured using an SOI substrate which is described in Embodiment Mode 1 or Embodiment Mode 2.

Embodiment Mode 5

A display panel can be also manufactured by application of the present invention. Now, a display panel using an SOI substrate which is manufactured by application of Embodiment Mode 1 and Embodiment Mode 2 is described.

Figure 11:
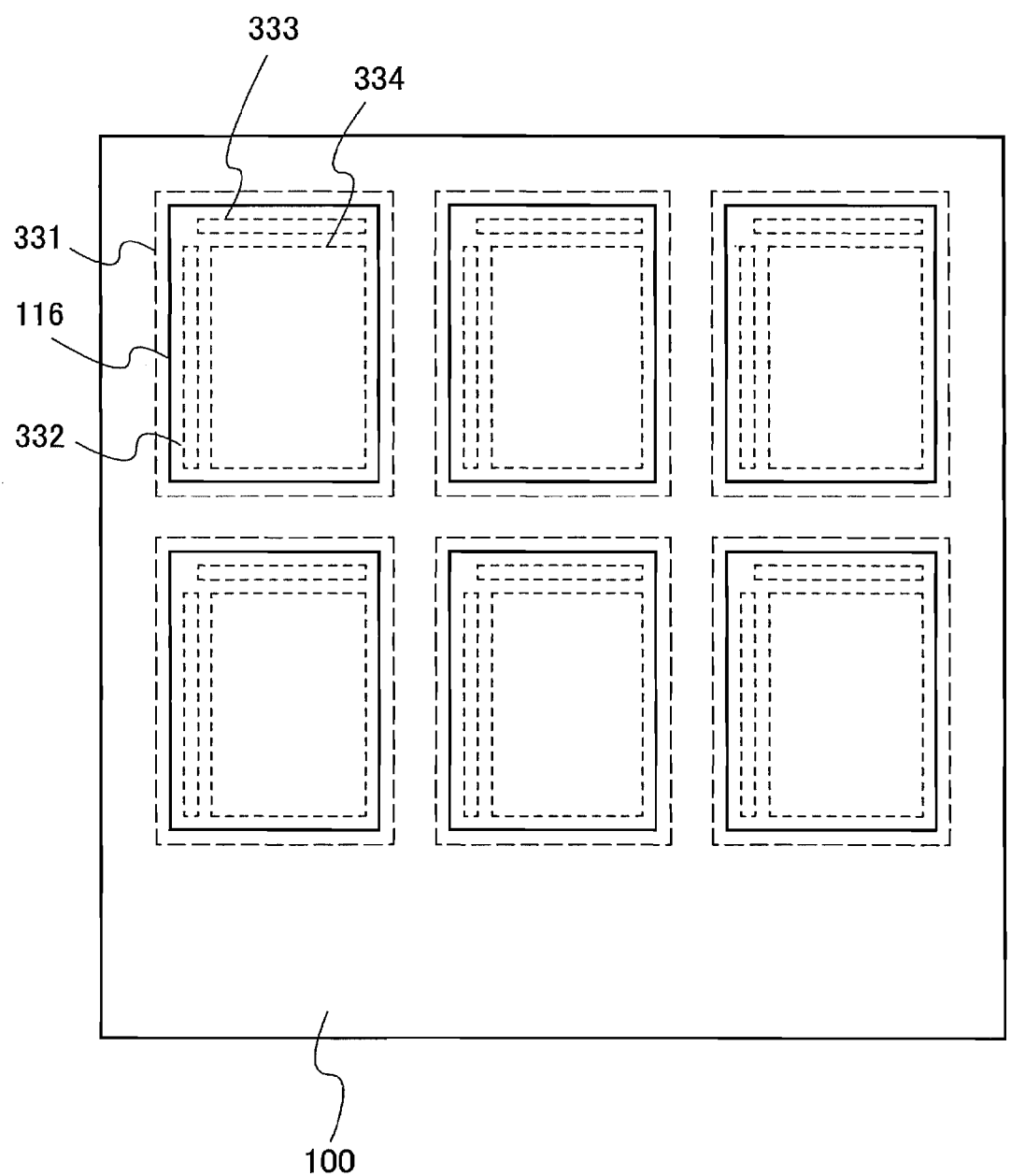
FIG. 11 illustrates an example of a light-emitting display panel in which an SOI substrate of the present invention is used.

FIG. 11 shows a case where a large-sized substrate is used as a first substrate 100, a semiconductor substrate 200 is bonded thereto, and then, an LTSS layer 116 is formed over the first substrate 100. Since a plurality of display panels is cut out from the large-sized substrate, the LTSS layer 116 is preferably bonded to match a formation region of a display panel 331. Since the large-sized substrate forming the display panel has a larger area than a single crystal semiconductor substrate, it is preferable that a plurality of the LTSS layers 116 is arranged separately as illustrated in FIG. 11. The display panel 331 includes a scanning line driver circuit region 332, a signal line driver circuit region 333, and a pixel formation region 334. The LTSS layers 116 are bonded to the first substrate 100 so that these regions are included.

Figure 12A:
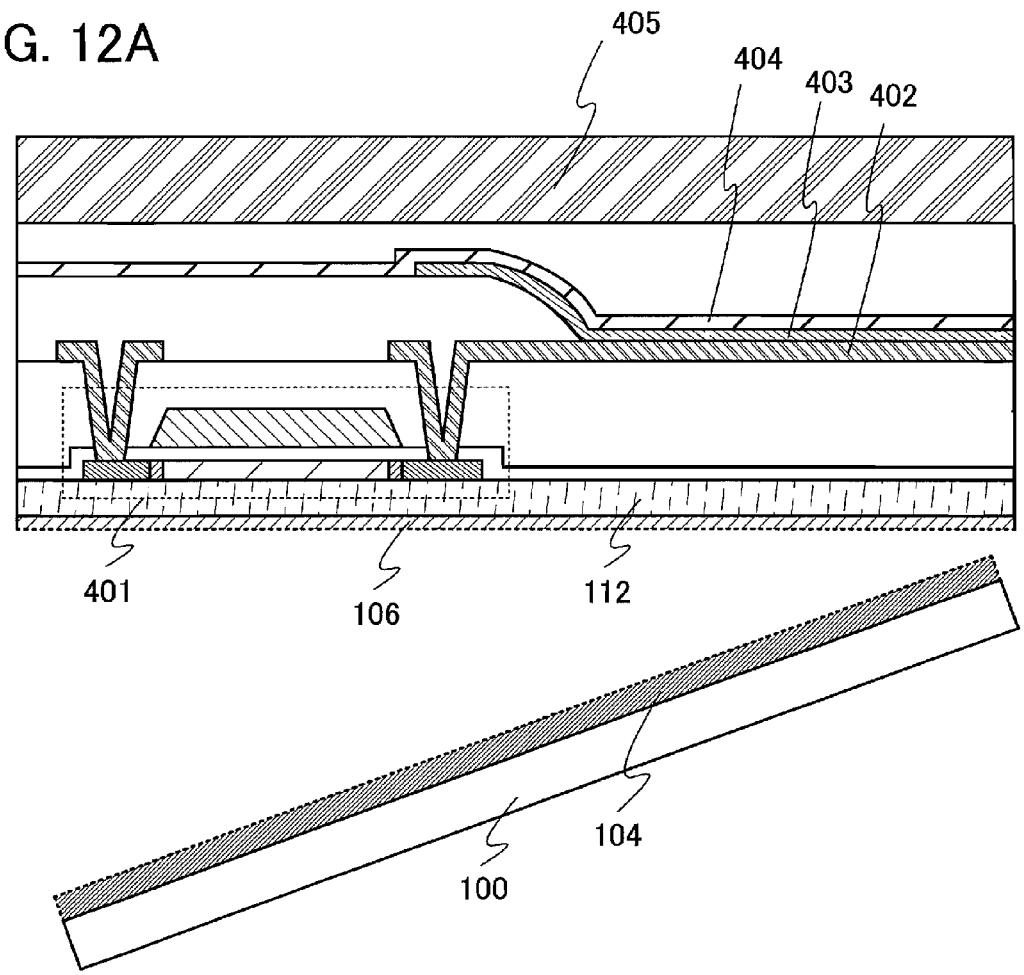
FIGS. 12A and 12B illustrate an example of a light-emitting display panel in which an SOI substrate of the present invention is used.
Figure 12B:
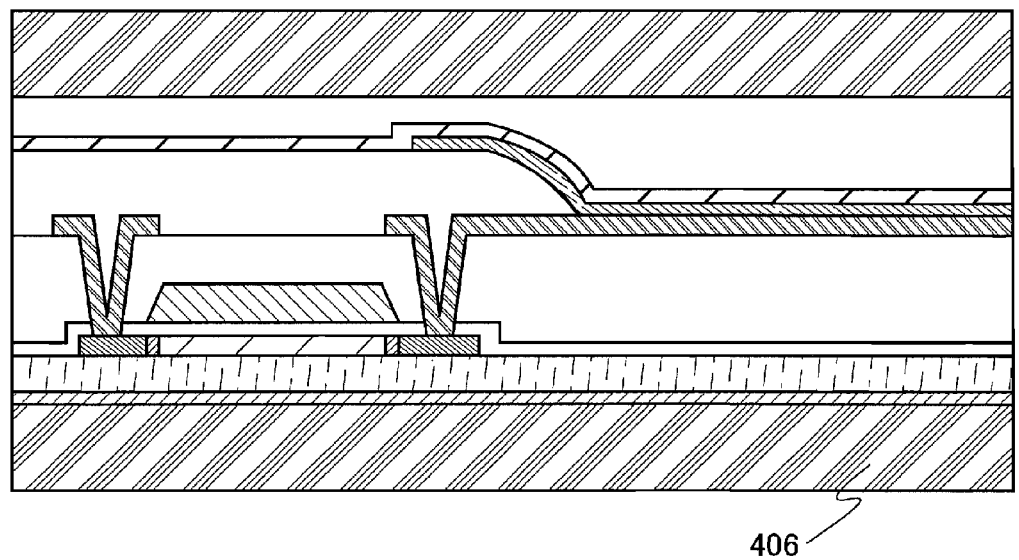
Figure 13:
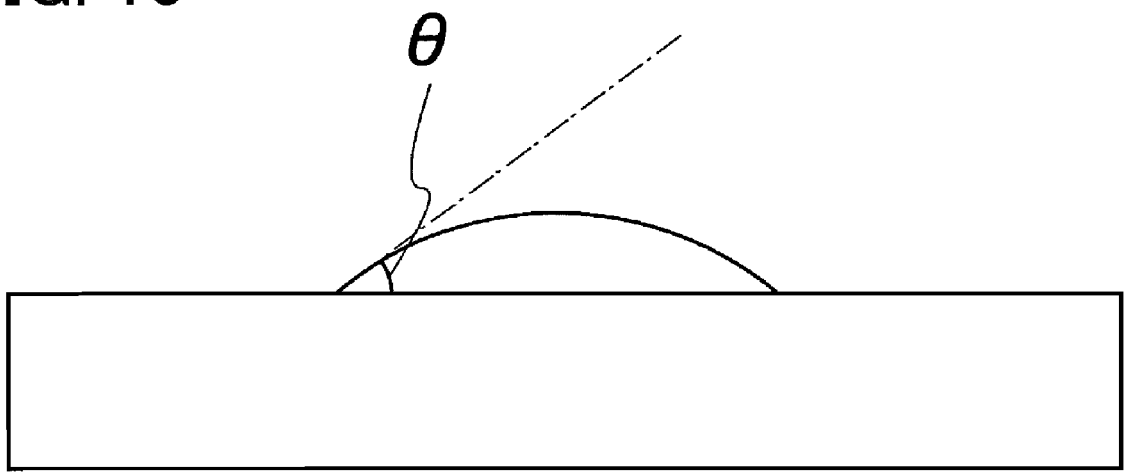
FIG. 13 illustrates a definition of hydrophilicity in the present specification.

FIGS. 12A and 12B show an example of a cross sectional views of a pixel of a light-emitting display panel in which a pixel transistor 401 is formed using the LTSS layers 116.

FIG. 12A illustrates that a light-emitting display panel is formed over the first substrate 100, and then separated from the first substrate 100. In FIG. 12A, the pixel transistor 401 is connected to a first electrode 402, an EL layer 403 is provided over the first electrode 402, and a second electrode 404 is provided over the EL layer 403. A plastic substrate 405 is used as a second substrate to which the light-emitting display panel is transferred. In FIG. 12A, separation is performed at the boundary between a first separation layer 104 and a second separation layer 106; however, the present invention is not limited to this.

FIG. 12B illustrates that a plastic substrate 406 is provided under the light-emitting display panel which is transferred in FIG. 12A. By provision of the plastic substrate 406 as described above, impact resistance or the like of the light-emitting display panel can be enhanced, and reliability can be improved.

As described above, a light-emitting display panel can be manufactured using an SOI substrate to which the present invention is applied; however, the present invention is just one example. That is, the present invention is not limited to this embodiment mode, and can be applied to various display devices manufactured using an SOI substrate which is described in Embodiment Mode 1 or Embodiment Mode 2.

In this manner, a light-emitting display panel to which the present invention is applied can be provided over a flexible large-sized substrate. The transistor formed using the LTSS layer has high carrier mobility, and extremely high performance as a semiconductor; therefore, the transistor can be made smaller. Thus, high definition can be obtained. Further, since the microprocessor described in Embodiment Mode 4 can be formed over the same substrate, function as a computer can be provided in a display panel. Similarly, a display which is capable of data input and output without contact can be manufactured.

Embodiment 1

In this embodiment, an experimental result for confirming that flattening of a separation layer can be achieved by a reverse sputtering method is described. Specifically, surface roughness of samples A and sample B was measured. In the sample A, a tungsten film was formed with a thickness of 30 nm over a glass substrate by a sputtering method, and a silicon oxide film was formed with a thickness of 250 nm over the tungsten film in a similar manner by a sputtering method. In the sample B, flattening treatment was performed to the sample A by a reverse sputtering method. The surface roughness was measured by atomic force microscopy (AFM).

In this embodiment, when a silicon oxide is formed, argon and oxygen were introduced into a chamber with a flow rate of 10 sccm and 30 sccm, respectively; pressure of the chamber was set to 0.4 Pa; and RF power was set to 3 kW. In the reverse sputtering method with a purpose of flattening, argon was introduced into a chamber with a flow rate of 50 sccm; pressure of the chamber was set to 0.6 Pa; and RF power was set to 0.2 kW. The reverse sputtering method is performed for 5 minutes.

As for the measured surface roughness, average surface roughness $R_a$ was calculated by formula (1) in Embodiment Mode 1.

Here, $S_0$ represents an area of a region to be measured by AFM, and $f(x,y)$ is a function showing surface roughness (unevenness) obtained by AFM.

In the sample A and sample B, the average surface roughness $R_a$ obtained from the above formula (1) was 1.97 nm, and 0.50 nm, respectively. In order to manufacture a semiconductor device by bonding a semiconductor substrate to a first substrate as described in this invention, $R_a$ is required to be equal to or less than 0.7 nm. For that reason, bonding is not favorably performed in the sample A but bonding is favorably performed in the sample B. Furthermore, since flattening can be performed by a reverse sputtering method, steps of forming a separation layer by a sputtering method and flattening the separation layer by a reverse sputtering method can be conducted in the same apparatus. As a result, a semiconductor device can be manufactured with a high throughput by application of the present invention.

This application is based on Japanese Patent Application serial no. 2007-239167 filed with Japan Patent Office on Sep. 14, 2007, the entire contents of which are hereby incorporated by reference.

What is claimed is:

1. A method for manufacturing a light-emitting device comprising the steps of:

forming a damaged area at a certain depth from a surface of a semiconductor substrate;

forming a separation layer over the semiconductor substrate in which the damaged area is formed;

forming an insulating film over the separation layer;

bonding the semiconductor substrate to a first substrate with the insulating film and the separation layer interposed therebetween;

separating the semiconductor substrate at the damaged area, so that a semiconductor layer is formed over the first substrate;

forming a semiconductor element by utilizing the semiconductor layer;

forming a light-emitting element electrically connected to the semiconductor element;

bonding a second substrate to the first substrate with the semiconductor element and the light-emitting element interposed therebetween; and separating the first substrate from the semiconductor element at the separation layer.

2. The method for manufacturing the light-emitting device according to claim 1, further comprising the step of:

flattening the separation layer before the step of forming the insulating film.

3. The method for manufacturing the light-emitting device according to claim 2, wherein the flattening is performed so that a surface where the first substrate and the second substrate are bonded has average surface roughness, $R_a \leqq 0.7$ nm; square of average surface roughness, $R_{ms} \leqq 0.9$ nm; and value of a largest difference in height between peak and valley, $R_{max} \leqq 9.2$ nm.

4. The method for manufacturing the light-emitting device according to claim 1, wherein the light-emitting element comprises a first electrode, an EL layer provided over the first electrode, and a second electrode provided over the EL layer.

5. The method for manufacturing the light-emitting device according to claim 1, wherein the second substrate is a flexible substrate.

6. The method for manufacturing the light-emitting device according to claim 1, wherein the separation layer is formed by using at least one selected from the group consisting of tungsten, molybdenum, titanium, tantalum, niobium, nickel, cobalt, zirconium, zinc, ruthenium, rhodium, palladium, osmium, iridium, and silicon.

7. The method for manufacturing the light-emitting device according to claim 1, wherein the separation layer has a stacked-layer structure of a metal layer and a metal oxide layer, a metal nitride layer, a metal oxynitride layer or a metal nitride oxide layer.

8. A method for manufacturing a light-emitting device comprising the steps of:

forming a damaged area at a certain depth from a surface of a semiconductor substrate;

forming a separation layer over the semiconductor substrate in which the damaged area is formed;

forming a first insulating film over the separation layer;

forming a second insulating film over a first substrate;

bonding the semiconductor substrate to the first substrate with the first insulating film and the second insulating film interposed therebetween;

separating the semiconductor substrate at the damaged area, so that a semiconductor layer is formed over the first substrate;

forming a semiconductor element by utilizing the semiconductor layer;

forming a light-emitting element electrically connected to the semiconductor element;

bonding a second substrate to the first substrate with the semiconductor element and the light-emitting element interposed therebetween; and separating the first substrate from the semiconductor element at the separation layer.

9. The method for manufacturing the light-emitting device according to claim 8 further comprising the step of:

flattening the separation layer before the step of forming the first insulating film.

10. The method for manufacturing the light-emitting device according to claim 9, wherein the flattening is performed so that a surface where the first substrate and the second substrate are bonded has average surface roughness, $R_a \leqq 0.7$ nm; square of average surface roughness, $R_{ms} \leqq 0.9$ nm; and value of a largest difference in height between peak and valley, $R_{max} \leqq 9.2$ nm.

11. The method for manufacturing the light-emitting device according to claim 8, wherein the light-emitting element comprises a first electrode, an EL layer provided over the first electrode, and a second electrode provided over the EL layer.

12. The method for manufacturing the light-emitting device according to claim 8, wherein the second substrate is a flexible substrate.

13. The method for manufacturing the light-emitting device according to claim 8, wherein the separation layer is formed by using at least one selected from the group consisting of tungsten, molybdenum, titanium, tantalum, niobium, nickel, cobalt, zirconium, zinc, ruthenium, rhodium, palladium, osmium, iridium, and silicon.

14. The method for manufacturing the light-emitting device according to claim 8, wherein the separation layer has a stacked-layer structure of a metal layer and a metal oxide layer, a metal nitride layer, a metal oxynitride layer or a metal nitride oxide layer.

* * * * *